Figure 1:
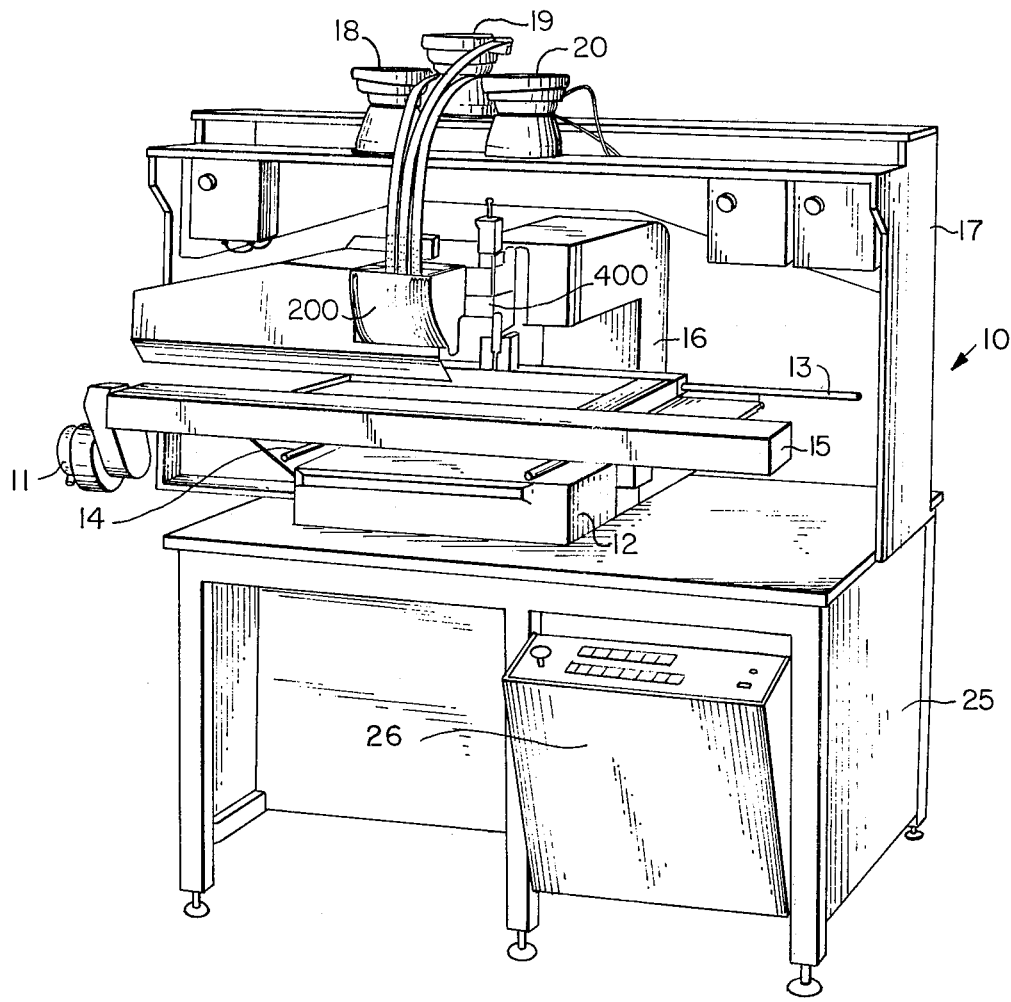

United States Patent [19]
Zemek et al.

[11] 3,972,100
[45] Aug. 3, 1976

[54] TRANSISTOR SEQUENCER INSERTER APPARATUS

[75] Inventors: Albert W. Zemek, Binghamton; Matthew R. Valla, Apalachin; Frederick G. Tomko, Vestal, all of N.Y.

[73] Assignee: Universal Instruments Corporation, Binghamton, N.Y.

[22] Filed: Oct. 29, 1974

[21] Appl. No.: 518,626

[52] U.S. Cl. .......................... 29/203 B; 29/203 DT; 29/569 R; 29/626
[51] Int. Cl.² .......................................... H05K 3/30
[58] Field of Search ........ 29/203 B, 203 DT, 203 P, 29/569, 587, 590, 626, 627

[56] References Cited
UNITED STATES PATENTS

| | | | |
|---|---|---|---|
| 3,592,375 | 7/1971 | Zemek et al. | 29/203 B |
| 3,618,192 | 11/1971 | Hoffken | 29/203 B |
| 3,691,864 | 9/1972 | Cochran et al. | 29/203 B |
| 3,727,284 | 4/1973 | Ragard et al. | 29/203 B |
| 3,777,350 | 12/1973 | Maeda et al. | 29/203 B |
| 3,859,707 | 1/1975 | Ragard et al. | 29/203 B |

*Primary Examiner*—Carl E. Hall
*Attorney, Agent, or Firm*—Fidelman, Wolffe & Waldron

[57] ABSTRACT

An apparatus for selecting predesignated transistor components from a plurality of loading stacks, transporting them to a pickup position by a shuttle mechanism, transferring them to an insertion head collet member, inserting them into a circuit board and clinching the leads thereof. The apparatus includes an X-Y axis positioning mechanism and a rotary holder for the circuit board that allows the components to be inserted into the circuit board at 0°, 90°, 180° and 270° orientations.

12 Claims, 74 Drawing Figures

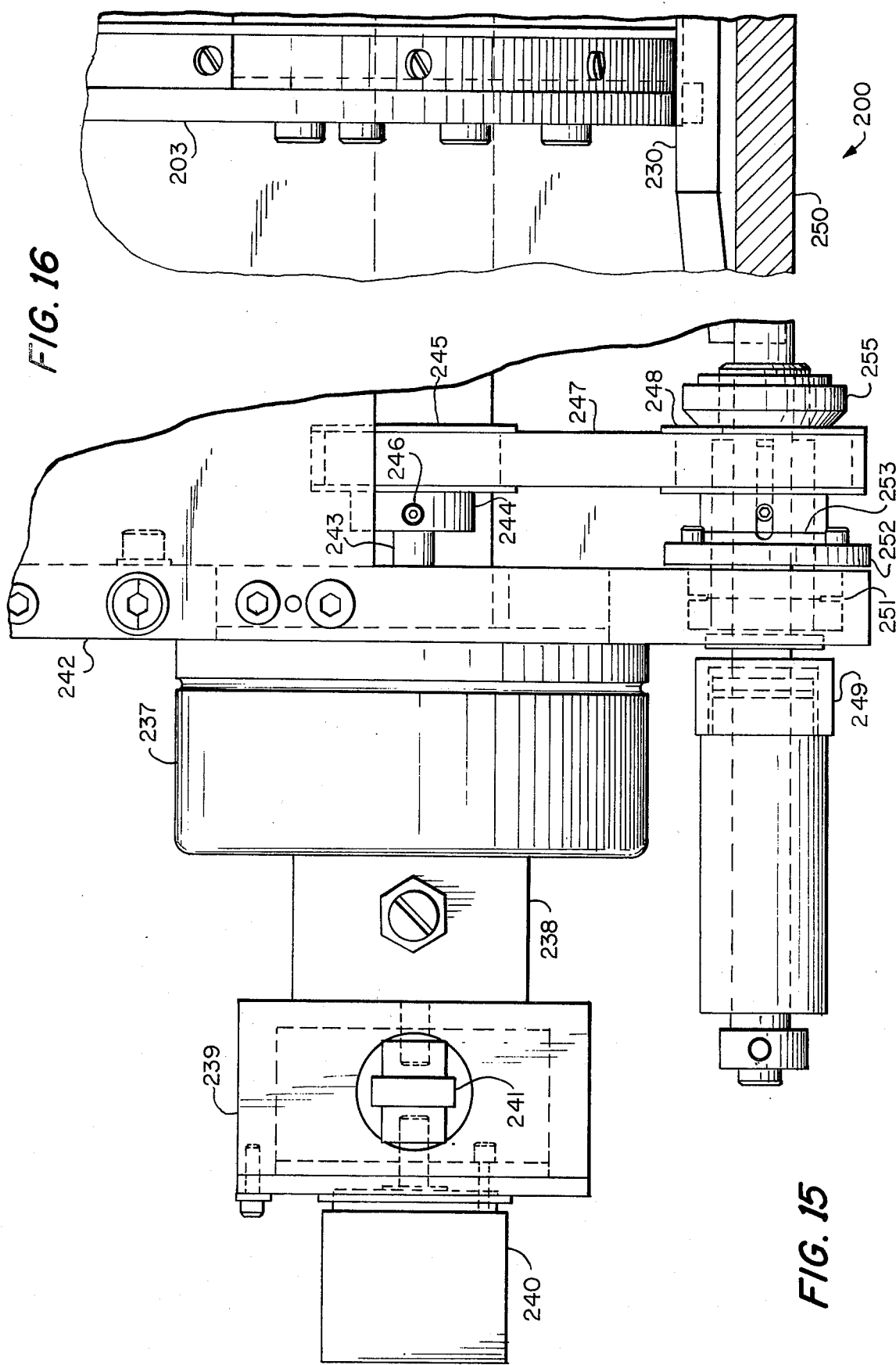

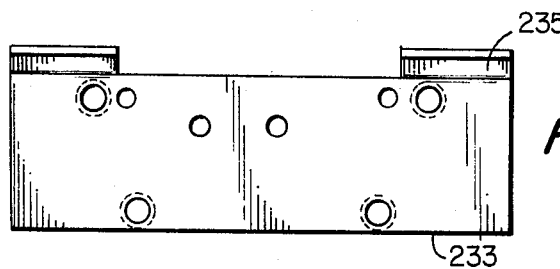
FIG. 25
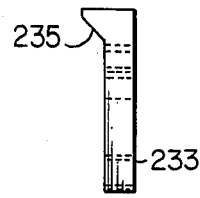
FIG. 26
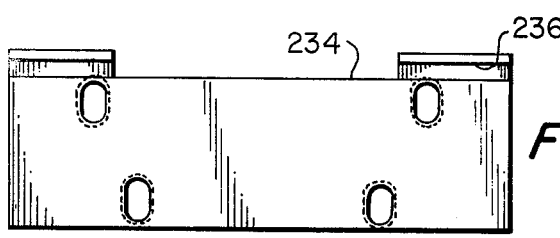
FIG. 27
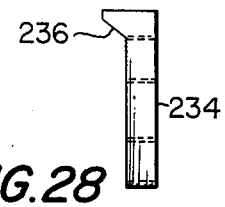
FIG. 28
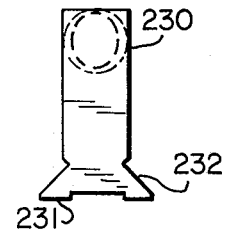
FIG. 19
FIG. 21　　　　FIG. 22
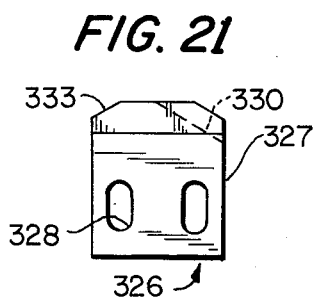 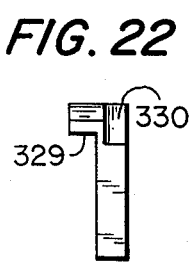 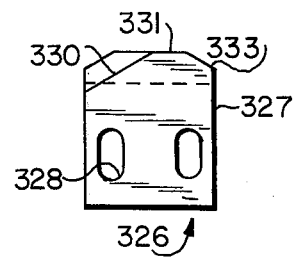
FIG. 23
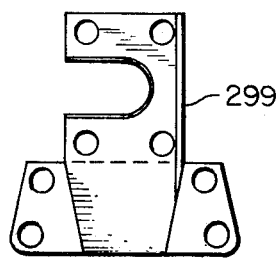 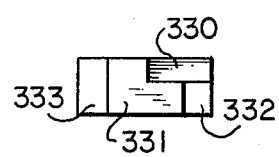
FIG. 24
FIG. 20

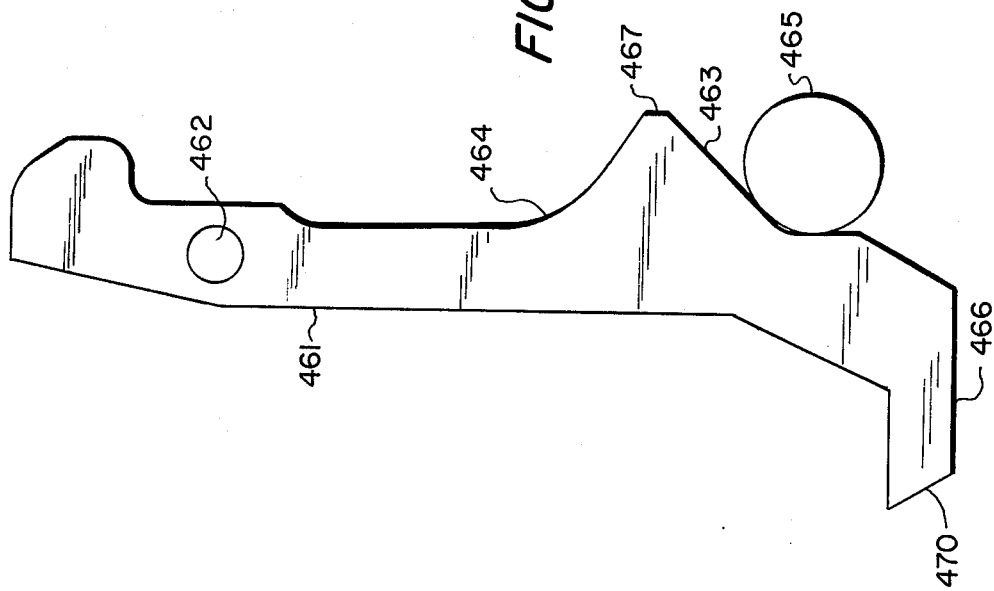
FIG. 53
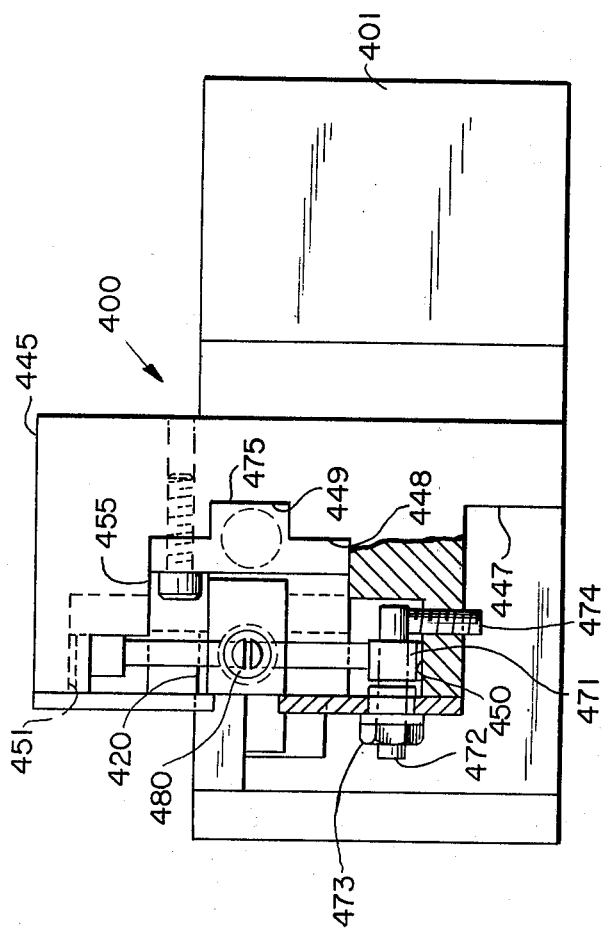
FIG. 48
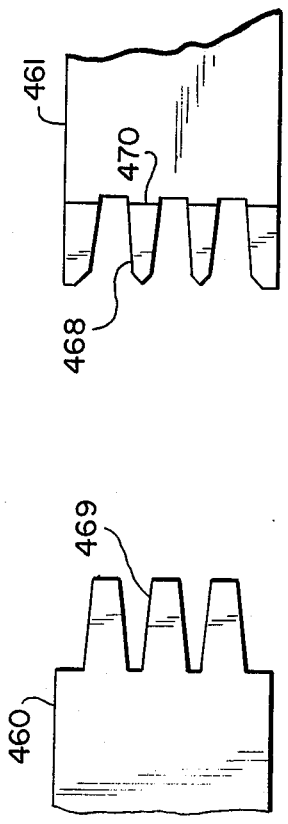
FIG. 55
FIG. 54

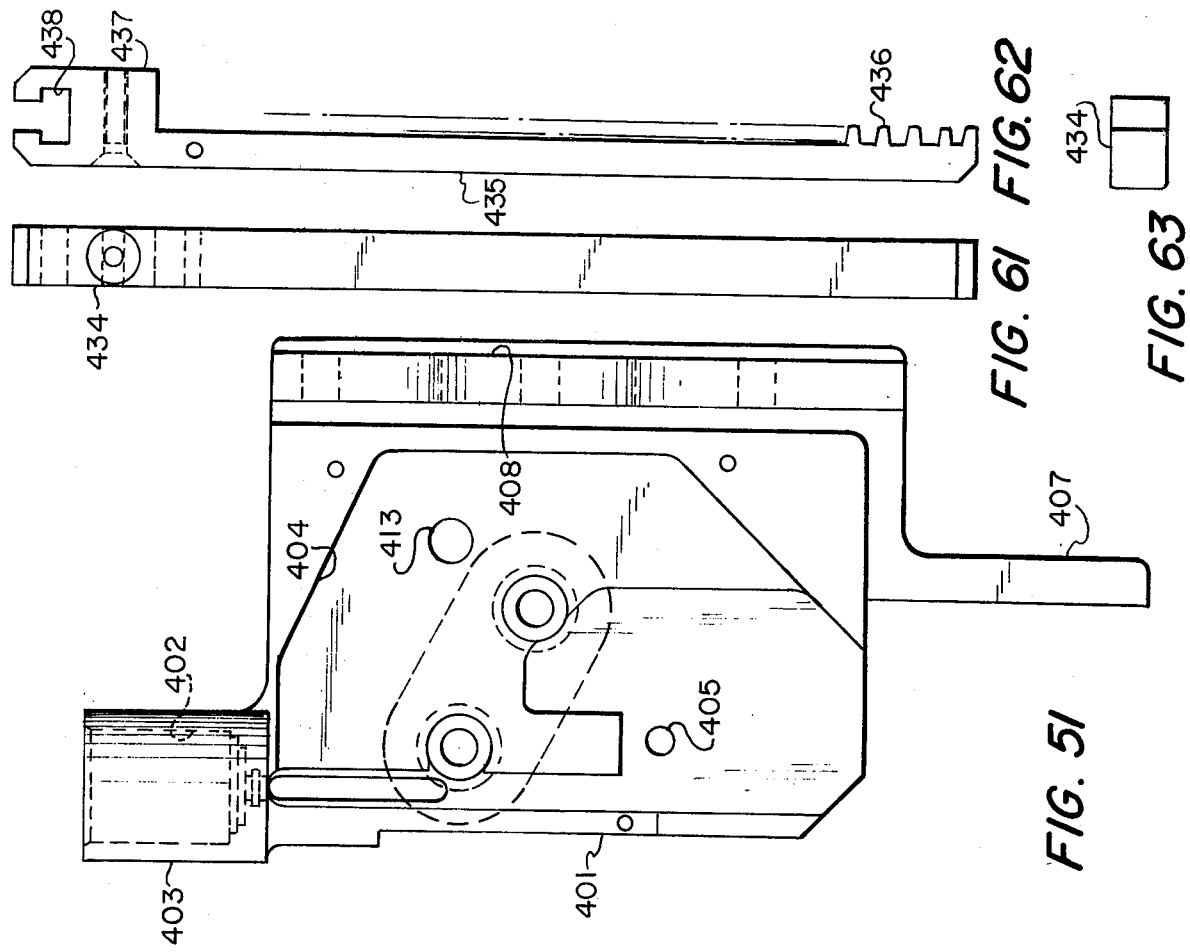
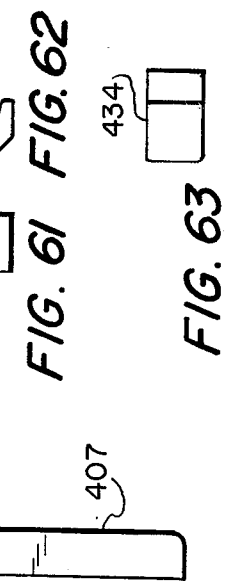
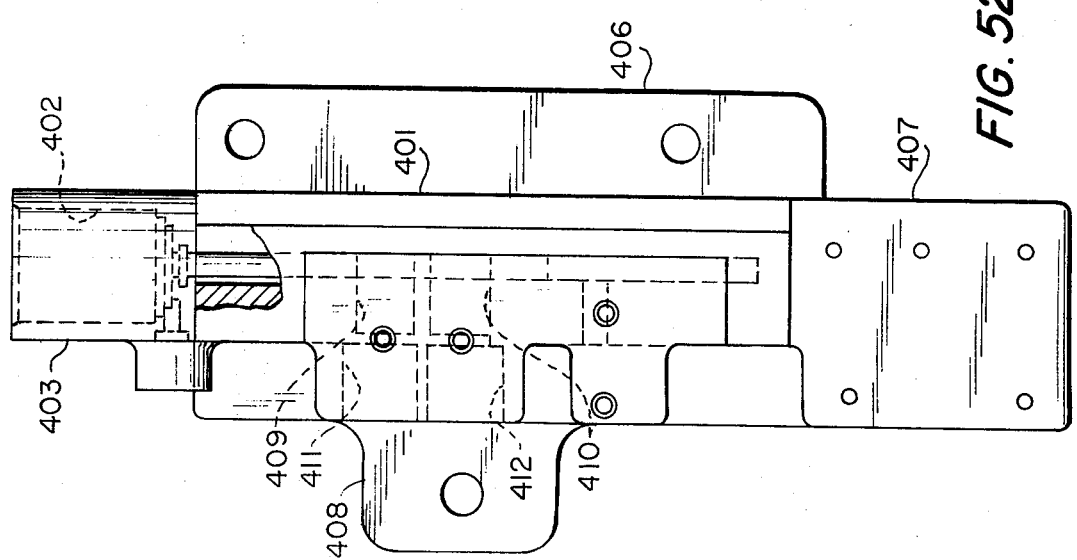

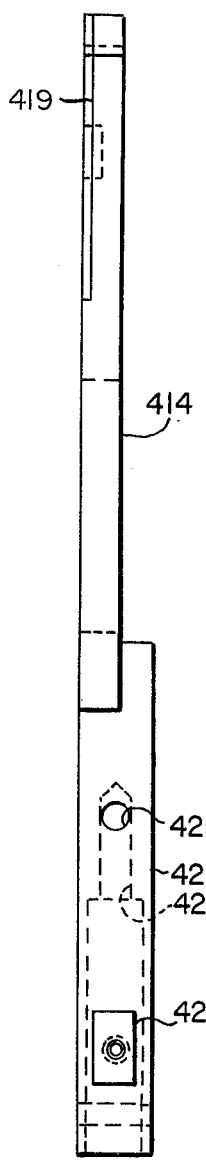
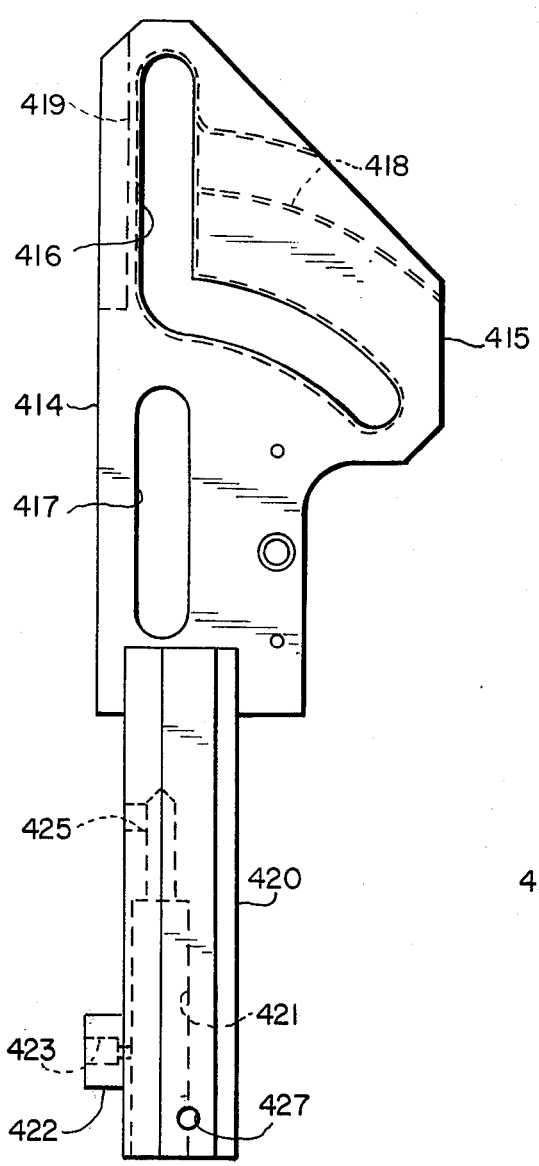
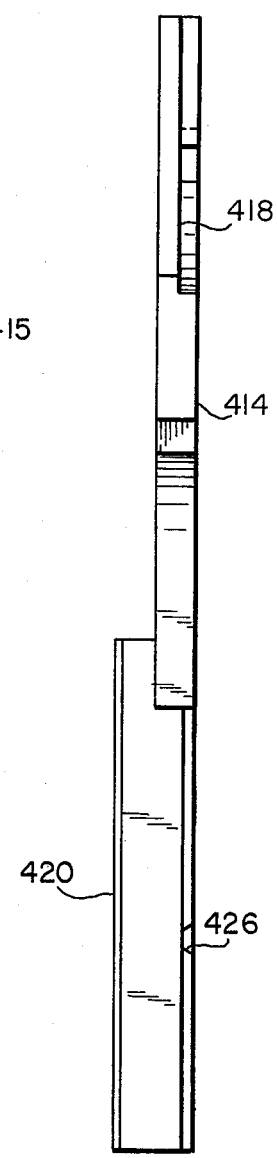
FIG. 56  FIG. 57  FIG. 58
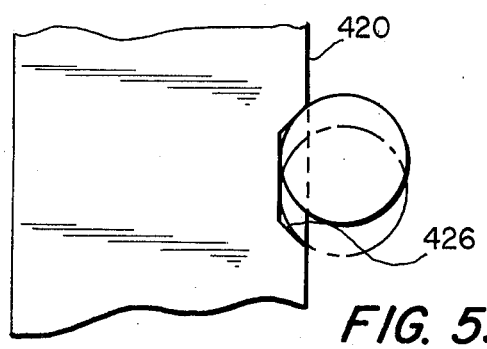
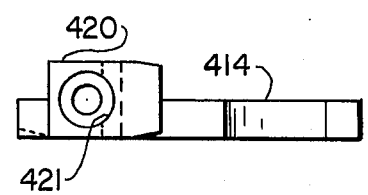
FIG. 59  FIG. 60

TRANSISTOR SEQUENCER INSERTER APPARATUS

This invention relates to an apparatus for inserting transistor components into a circuit board in any one of four different orientations. It can be fed from individual magazines containing the components or a plurality of vibratory bowl feed mechanisms. The system includes an insertion head, a cut and clinch unit, a 12-station random access sequencing feed system and a rotary X-Y positioning work holding table. The system is designated for insertion applications requiring as many as 12 different semiconductor values per insertion pass, however, the body size and lead requirements should be the same for all stations.

The feed system can be set up for component high density requirements using bulk loading bowl feed or maximum variety using stick feed or a compromise of both. The magazines will accept up to 12 sticks or four bowl tracks maximum. The maximums are (1) four bowls and four sticks, (2) three bowls and six sticks, (3) two bowls and eight sticks, or (4) one bowl and 10 sticks.

The advantage of the bowl feeder input over the stick feed is it is better suited for high volume use of the same type(s) of transistors. Less handling and no prepackaging, after lead prepping, is required. On the other hand, the stick feed input can handle a greater variety of transistor types on a single program. Where the full bowl feeder model can process only a maximum of four different transistor types, the stick feeder can handle up to 12.

The insertion process can be controlled by a digital computer or a program tape machine.

Insertion positioning is maintained by two moveable tables (X and Y axes) which are computer controlled. The circuit board is mounted on the X table on a workboard holder. Each table is driven by individual motors and positioning can be monitored.

The transistors are bulk loaded into vibrator bowl feeders which feed into the magazine section of the machine. The magazine section consists of 12 compartments, each of which can be randomly addressed by a controller. With the bowl feed system addressing is restricted to the compartments to which the feed tracks are attached.

The shuttle assembly (Z axis), which extracts the transistor from the selected magazine compartment can be program controlled. The shuttle transports the component to the unload position. The component is then picked from the shuttle by the swing arm, which is part of the insertion head. The swing arm transfers the component to the insertion position where the head inserts it into the circuit board. The clinch unit is raised simultaneously to support the board and clinch the leads in the direction specified by the program.

The circuit board being processed is held in a workboard holder. A rotary workboard table is optional and is program positioned at 0°, 90°, 180° and 270° to allow transistor orientation on the workpiece.

The X-Y table assembly is a precision positioning device which holds and positions the circuit card or board during processing. The card is held by the workboard holder which is precisely located on the X-table to allow exact insertions in the desired orientation to be made. The table assembly is composed of two tables, two motor drives, and two encoders. The encoders provide table movement data to the controller. The X-table is mounted on the Y-table and travels on a left-to-right axis. The Y-table is mounted to the table base and travels on a front-to-back axis. The drive motors are printed circuit units capable of producing a table speed of 600 inches per minute.

There are three limit switches associated with each table (see Electrical Diagram).

The X-table limit switches (1RS and 2RS) monitor the plus and minus limits of the X-table travel.

The workboard holder is program indexed to four possible locations, 0°, 90°, 180°, and 270°. Positioning of the table allows for transistor orientation in the four possible configurations.

When the program calls for a change in workboard orientation, the table solenoid is energized releasing the table stop. Air pressure is constantly applied to the table motor impeller. When the stop is released, the table begins a clockwise rotation carrying the attached printed circuit card with it. Limit switches monitor the table's position. When the limit switch detects the selected index position, the table stop solenoid is de-energized extending the stop arm. Locking into the table stop the table located limit switch closes allowing the insert cycle to begin.

The magazine section is made up of 12 separate compartments. The compartments hold the components to be processed. Each is individually selectable by the pattern program, however on the bowl feed models, only those compartments connected to a bowl feeder should be programmed. The components are fed into the magazine section properly oriented to be extracted by the shuttle mechanism. The components are generally processed with the flat side to the right.

The function of the shuttle assembly is to extract the components from individual magazine compartments and transport them to the UNLOAD position. Shuttle movement is considered as the Z axis.

The assembly consists of the drive motor, lead screw, rotary encoder, rotate cylinder, and clamp cylinder.

The drive motor drives the shuttle to the desired magazine compartment. The rotary encoder monitors shuttle movement and transmits movement data back to the controller. When the shuttle is positioned at the desired magazine compartment the shuttle rotate solenoid valve is energized to actuate the rotate cylinder. (Rotate In = not home) The rotate cylinder rotates the clamp, which is held open by spring tension at this time, to the component. The clamp solenoid valve is then energized to actuate the clamp cylinder. With pneumatic pressure to the clamp cylinder, the tension of the spring is overcome and the part is clamped. With the part clamped, the rotate solenoid is de-energized (Rotate Out = Home) to position the clamp and part in preparation for the move to the UNLOAD position. A drive signal is then generated by the computer or controller to move the shuttle and part to the unload station for transfer to the insertion head.

There are three switches which monitor shuttle movement along the Z axis. Two of the switches monitor the plus and minus limits of shuttle travel. When either switch is made, a + or − Out of Limits signal is sent to the controller or computer and the operation ceases.

The other limit switch is the Z axis In Range switch. This is a normally closed switch which, when opened, informs the controller that the Z axis is approaching home position. This indicates to the controller that the next home pulse from the rotary encoder is valid and stops the shuttle at the HOME position.

The function of the insertion head is to pick up the part from the clamp, transfer it to the insertion position, and insert it into the circuit board.

The operation of the insertion head is divided into two cycles: swing arm cycle and insert cycle. The head is programmed to perform each cycle by a controlling solenoid valve, referred to as the operation solenoid.

The valve controls the swing arm cylinder and the insert cylinder. The normal condition of the valve is de-energized and a limit switch made. This is the condition from which head operation begins. In the de-energized condition pins within the head are set to perform a swing arm cycle. When energized, the valve switches the pins to set the head up for an insert cycle.

The drive solenoid controls the head drive cylinder. When the drive solenoid is energized, the drive cylinder is actuated to drive the head down. The head, at the beginning of the operation, is programmed to perform a swing arm cycle. The swing arm then swings forward to pick the part from the shuttle assembly. With the part properly picked up, the drive solenoid is de-energized to return the swing arm home. The operations solenoid is then energized to switch the head from swing arm to insert operation. The drive solenoid is again energized to drive the head down to insert the part into the circuit board.

The insert plunger, within the tip of the head, has two functions. When the part is picked up by the swing arm the plunger is moved off a pressure switch thereby indicating that a part is present. If a part is not present in the head the operation ceases. During the actual insertion of the part into the circuit board, the insert solenoid is actuated. This holds the plunger down against the part, preventing the part from being pulled back out when the head is retracted.

In operation the operation solenoid is de-energized indicating that the head is set to perform a swing arm cycle. The drive solenoid is then energized causing the swing arm to pick up a part from the clamps on the shuttle mechanism. The component being picked up by the swing arm moves the insert plunger off a pressure switch indicating that a part is present in the head. Another switch is made when the component is picked up and the drive solenoid is de-energized returning the swing arm to its initial position. Still another switch is then made to allow the operations solenoid to be energized. When this occurs the insertion head is set up to perform an insert operation.

The drive solenoid is again energized to drive the head down and insert the part. when the part or component is inserted into the board the insert plunger solenoid is energized. This causes the plunger to hold the part to the board preventing it from pulling the component back out when the head is retracted. After a small delay, the drive solenoid is de-energized to retract the head. The insert plunger is then activated returning it to its initial position. After this, the operations solenoid is de-energized thereby setting the head for the next swing arm operation.

The X-Y tables are then moved to the next insert position. The insertion head may also be manually controlled for purposes of initially setting up the apparatus.

The function of the clinch assembly is to provide support for the circuit board during insertion and clinch the leads to the circuit side of the board. The clinch anvil is raised simultaneously with the insert operation to provide support to the circuit board. The outside leads are clinched in the same direction, either left or right from the center of the cut and clinch anvil. The center lead is clinched in the opposite direction of the outside leads. The clinch pattern is normally fixed although an optional clinch unit is available. This clinch unit is programmable to clinch in either direction.

Accordingly, it is an object of this invention to provide an apparatus for sequentially and automatically inserting components of differing electronic values into a circuit board or card.

A further object of this invention is to provide an apparatus for selecting one of up to twelve different components, inserting it into a circuit board and then clinching the leads.

Another object of this invention is to provide an insertion head that moves to pick up a component from a first position, move it to an insertion position and then insert it into a circuit board.

A still further object of this invention is to provide a shuttle assembly and magazine whereby the shuttle assembly is capable of moving along the magazine assembly, selecting a particular component and delivering it to a predetermined position.

Another object of this invention is to provide a collet assembly capable of picking up a component and holding it during an insertion operation.

Figure 18:
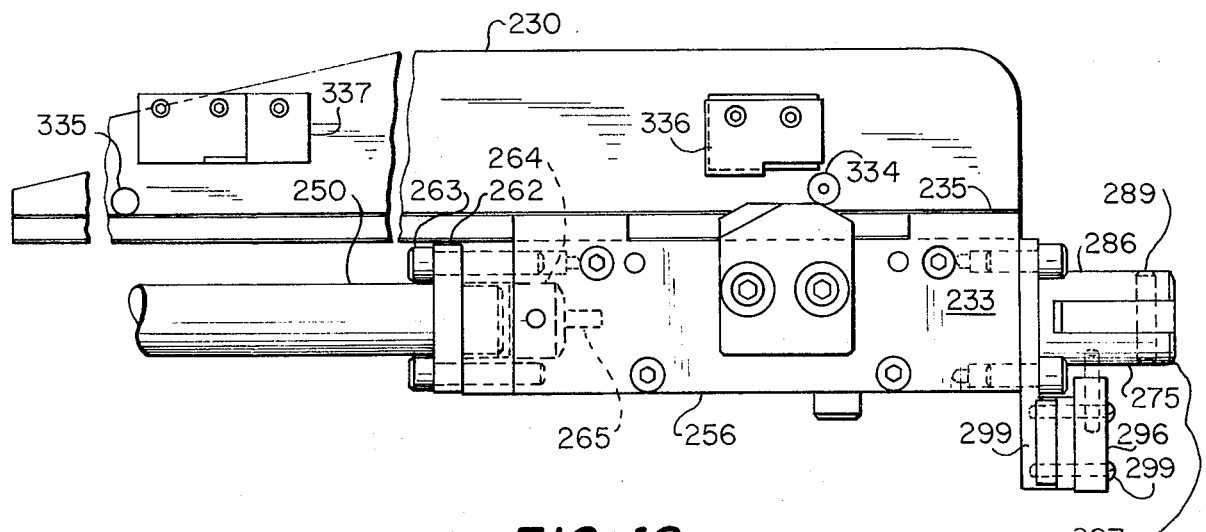
Figure 2:
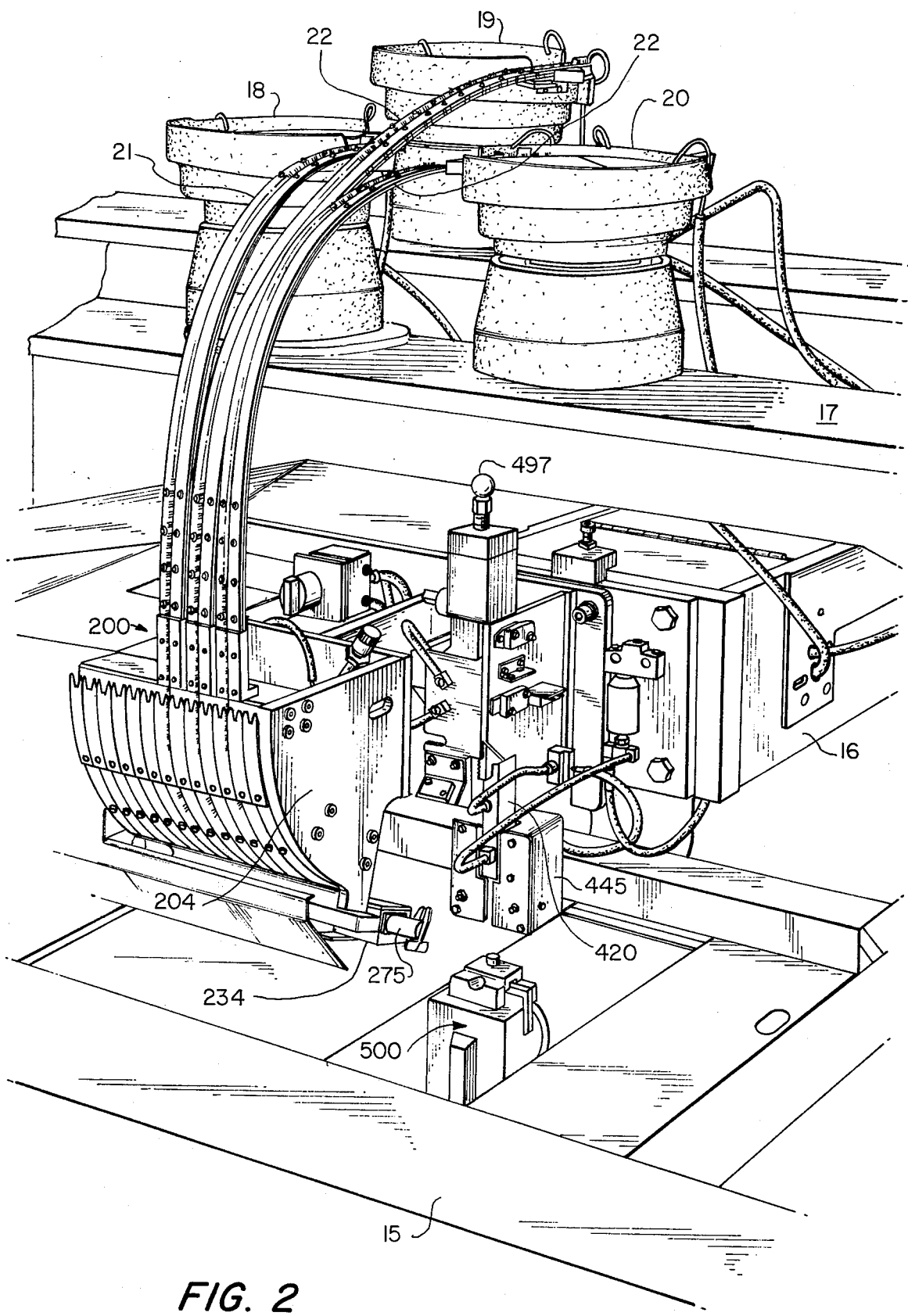
Figure 3:
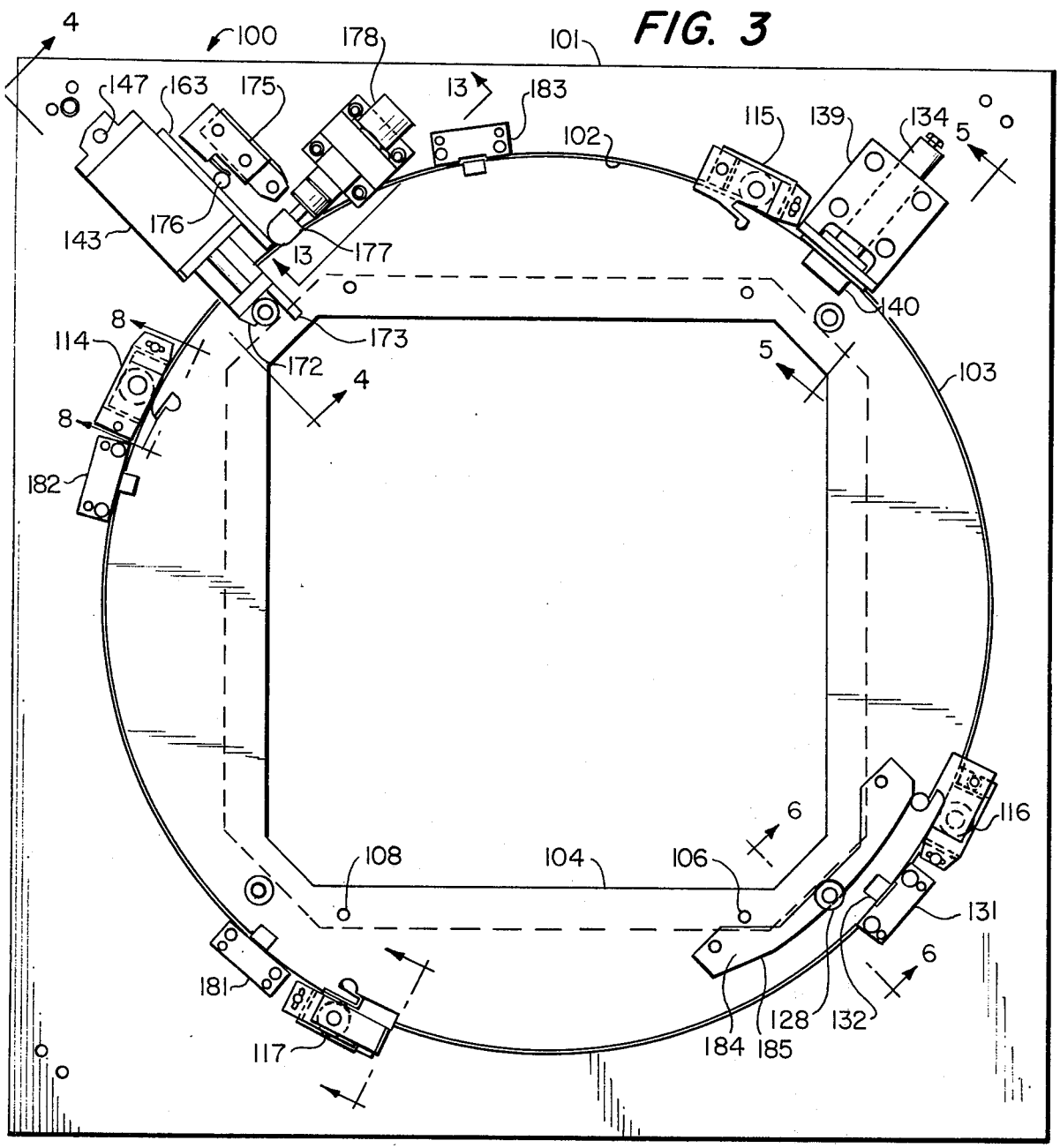
Figure 13:
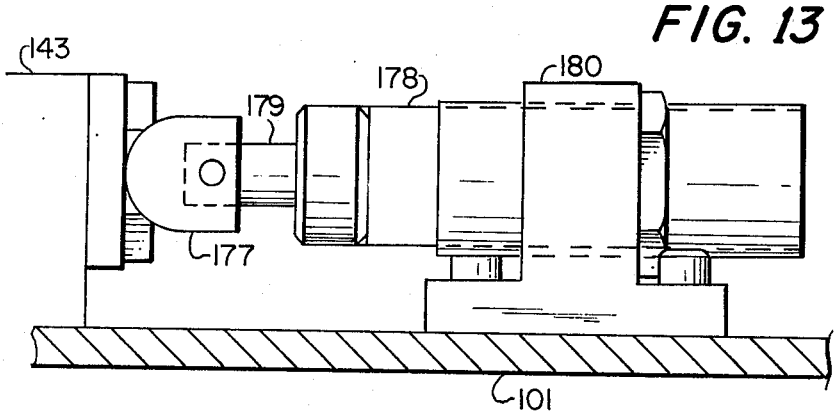
Figure 9:
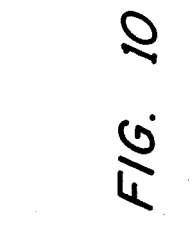
Figure 11:
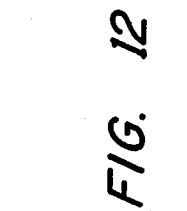
Figure 10:
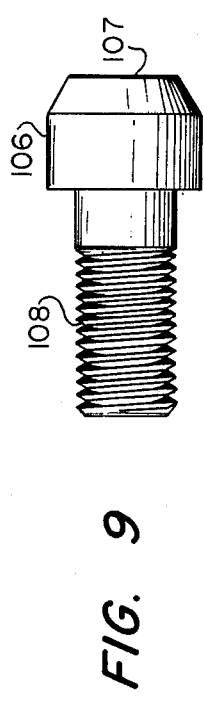
Figure 12:
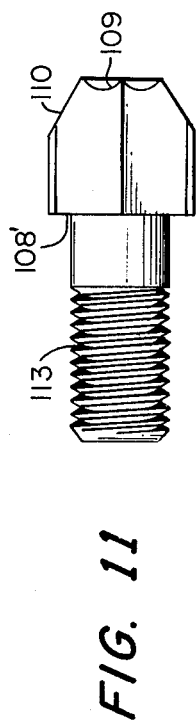
Figure 4:
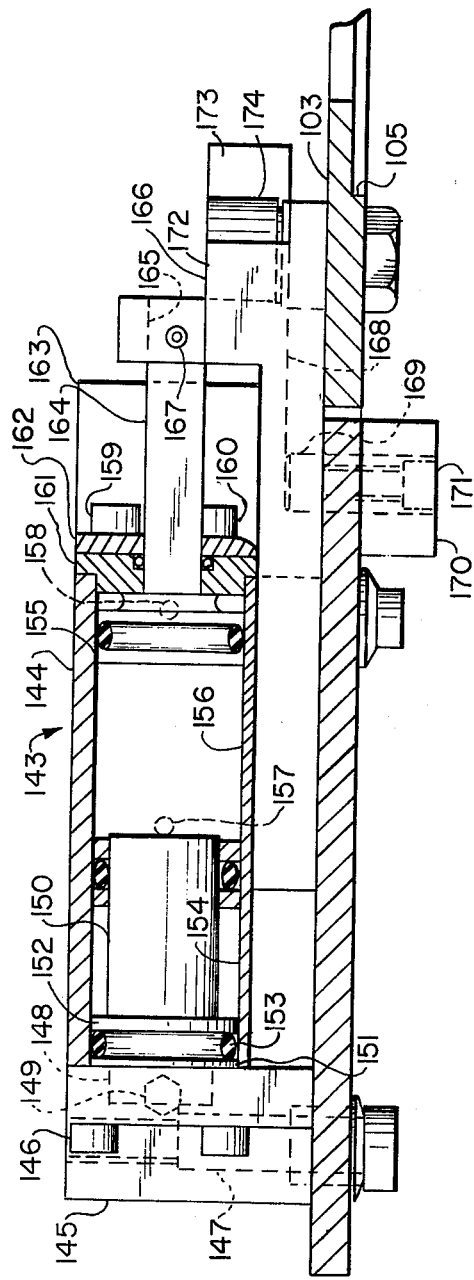
Figure 5:
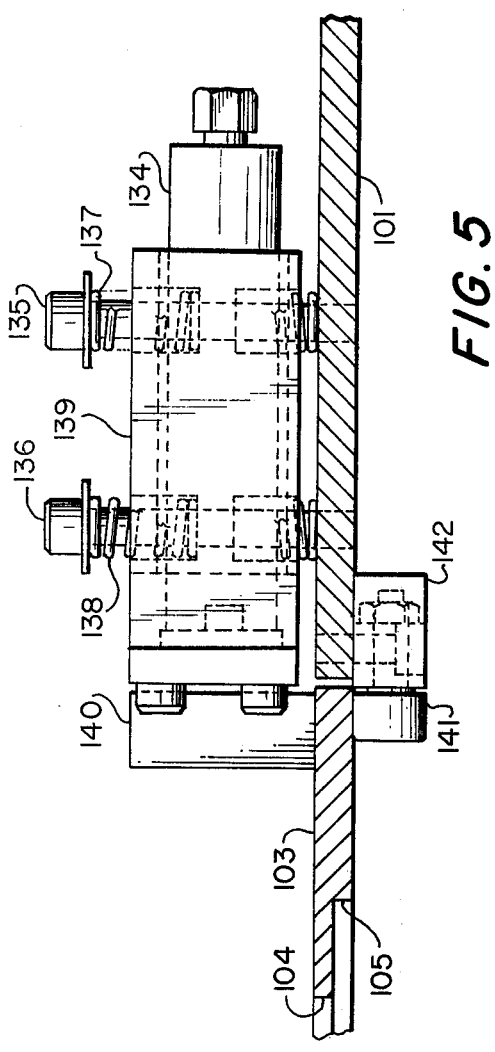
Figure 6:
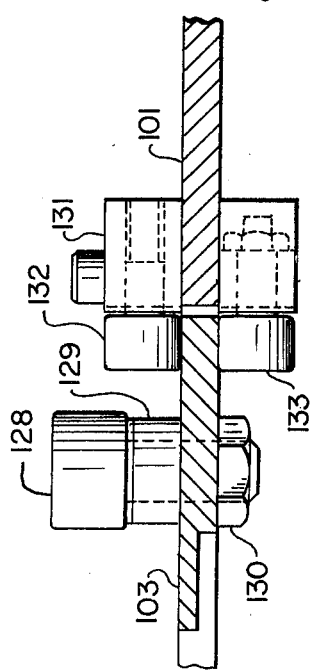
Figure 8:
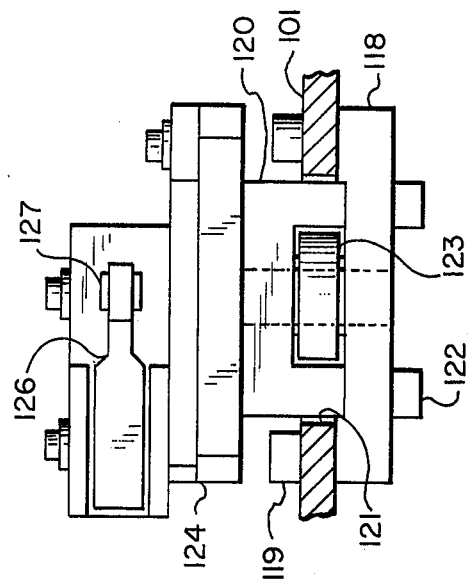
Figure 7:
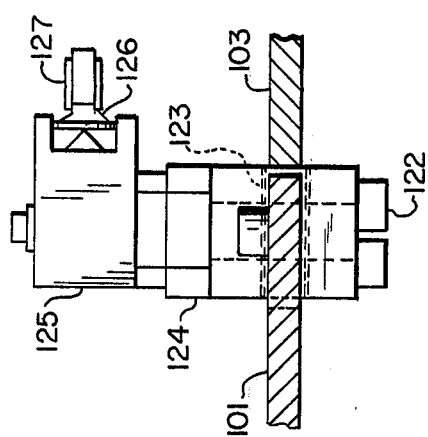
Figure 14:
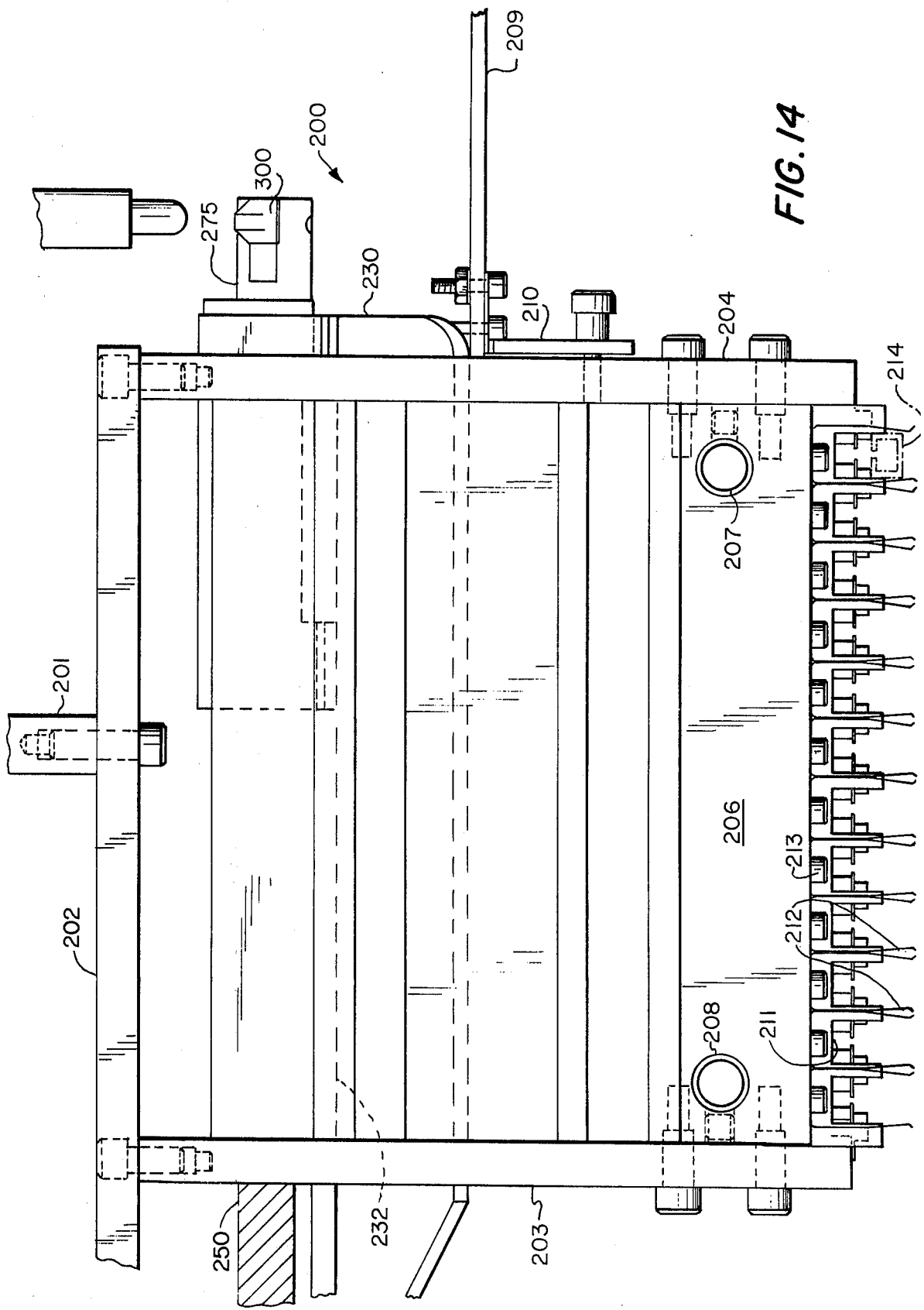
Figure 17:
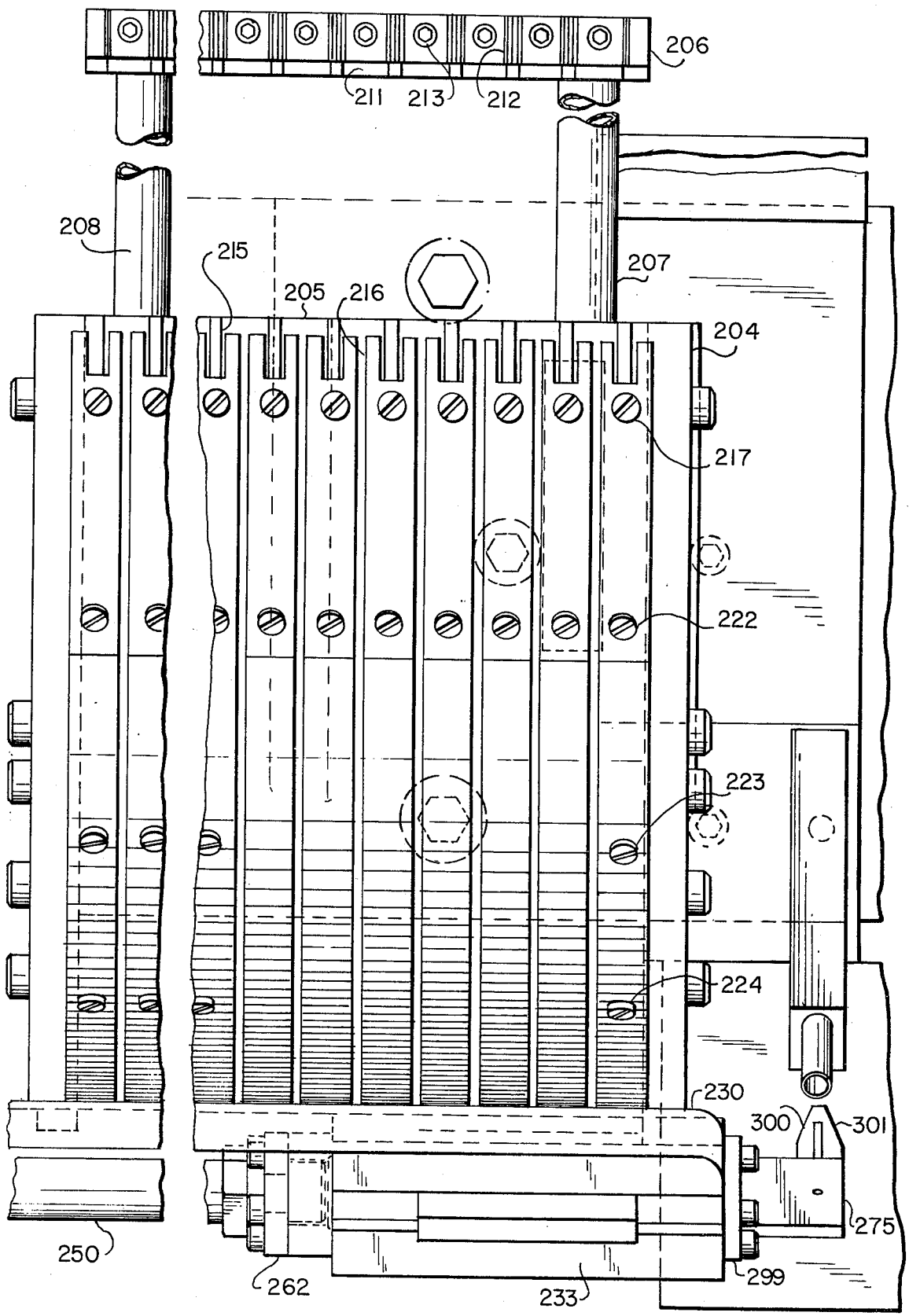
Figure 29:
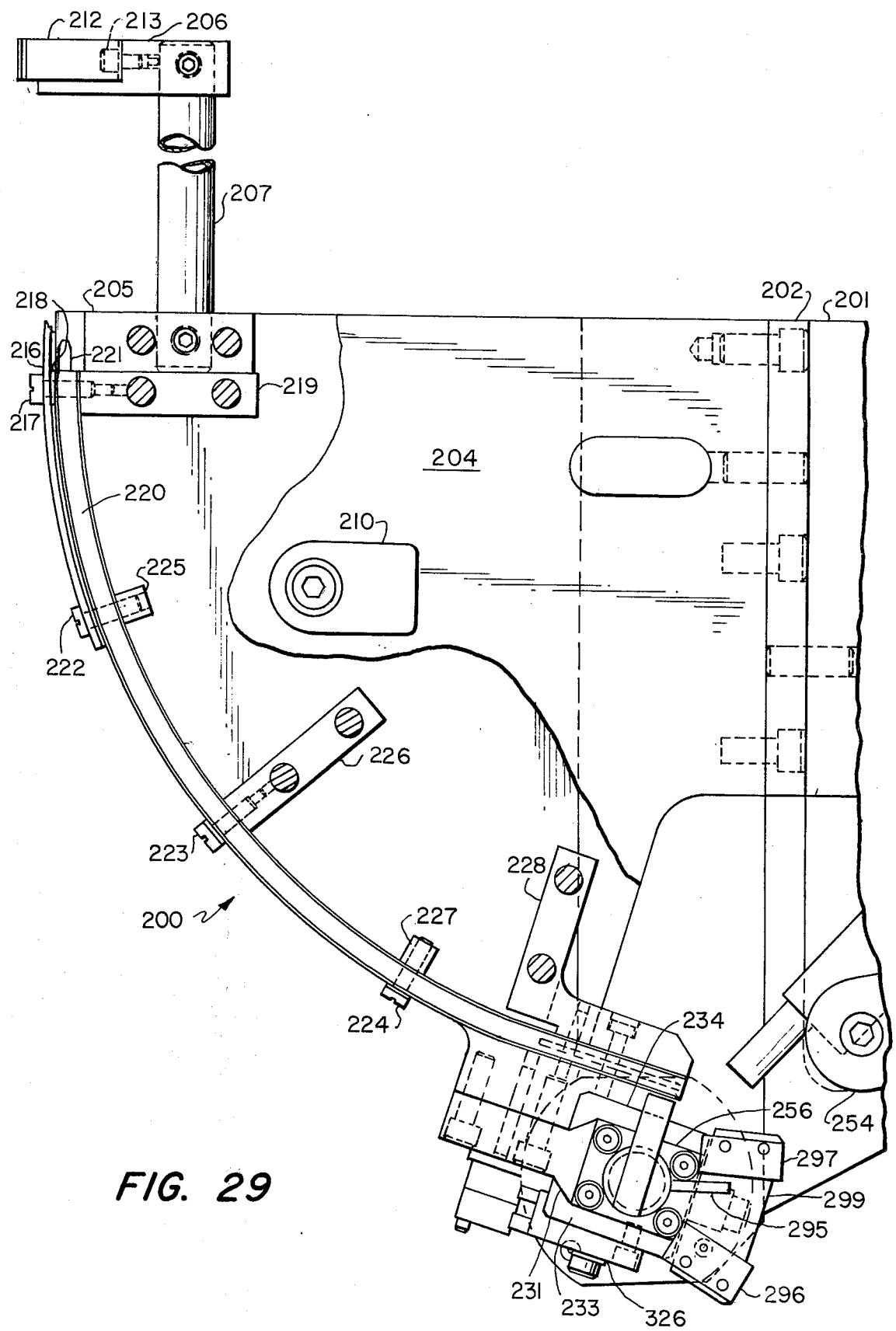
Figure 30:
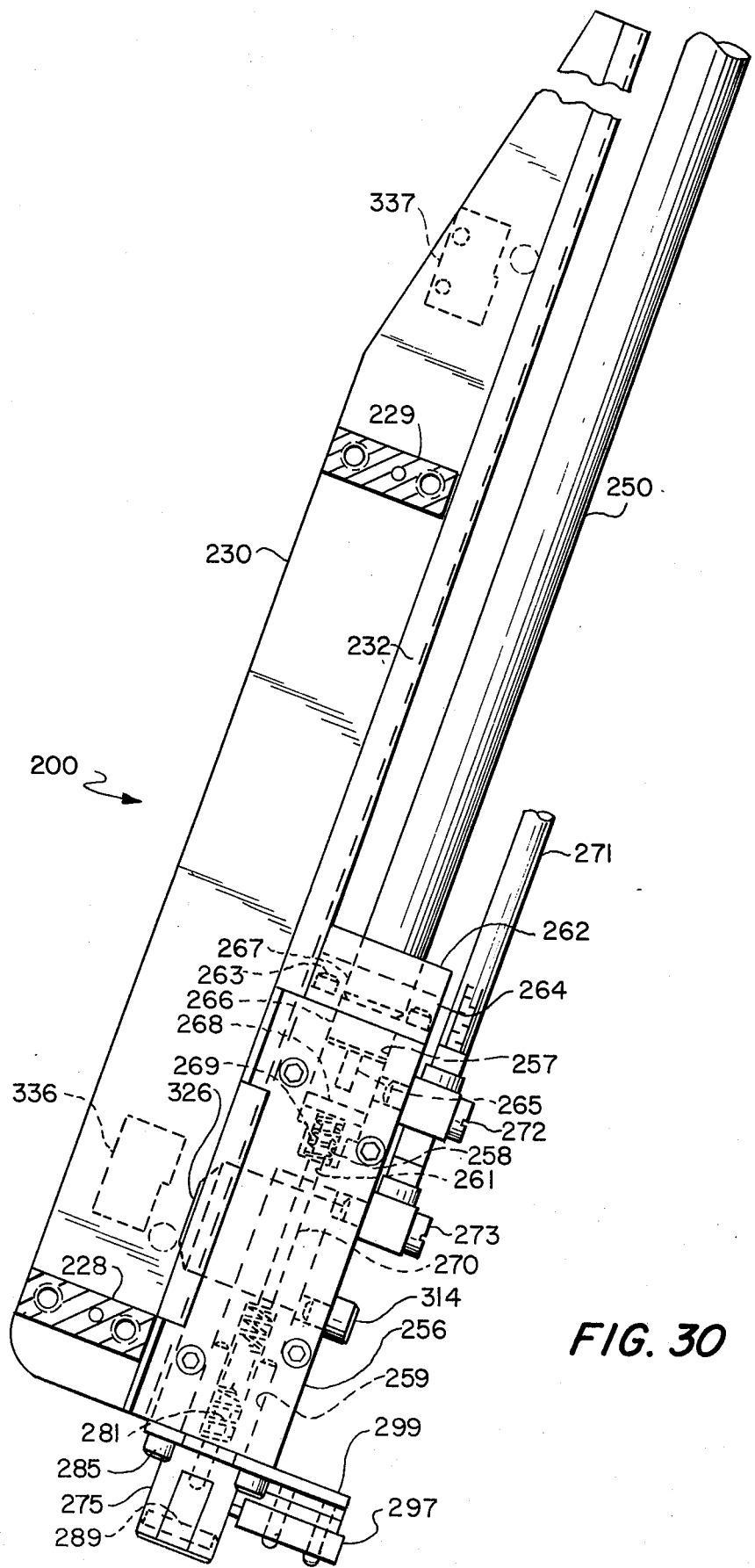
Figure 49:
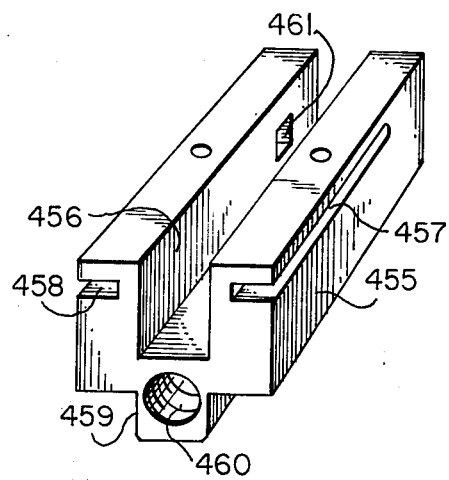
Figure 50:
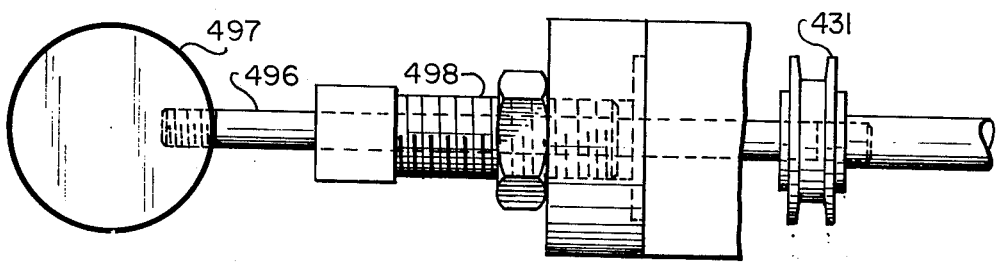
Figure 31:
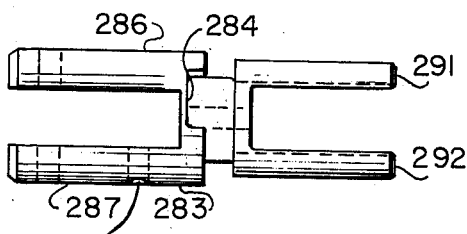
Figure 33:
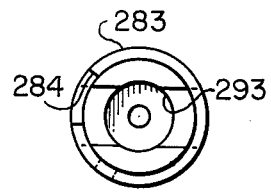
Figure 32:
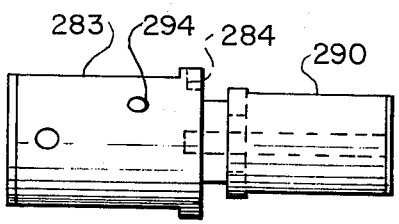
Figure 34:
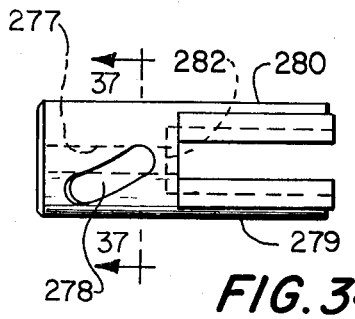
Figure 36:
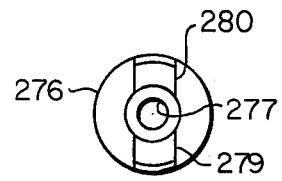
Figure 35:
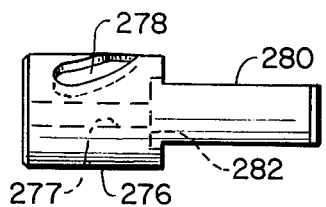
Figure 37:
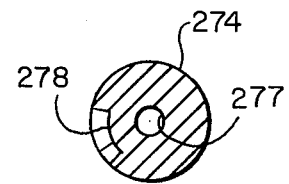
Figures 64, 66:
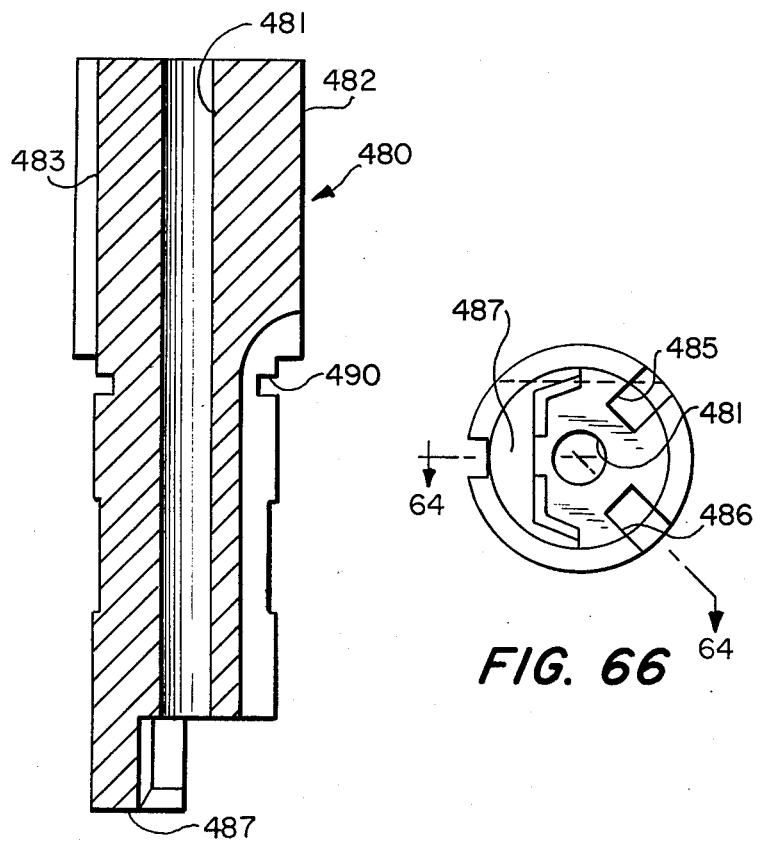
Figure 65:
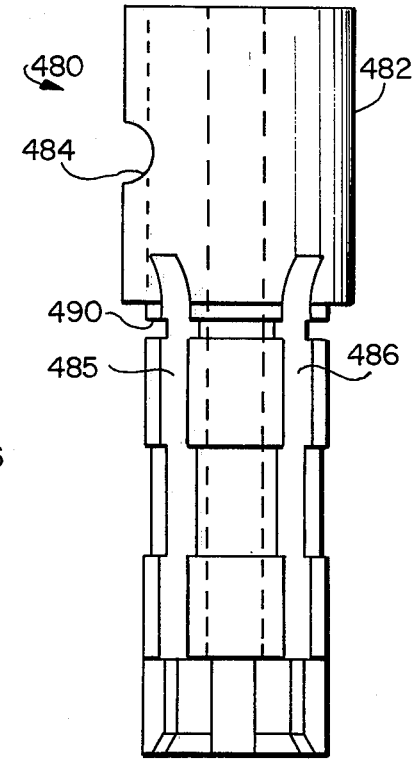
Figure 38:
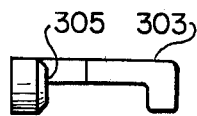
Figure 39:
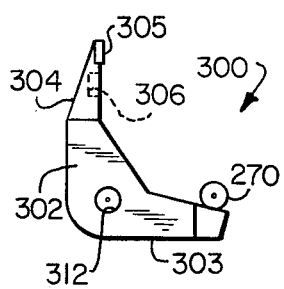
Figure 40:
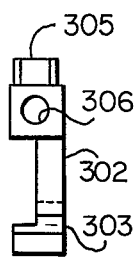
Figure 41:
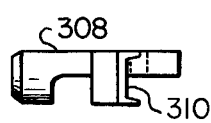
Figure 42:
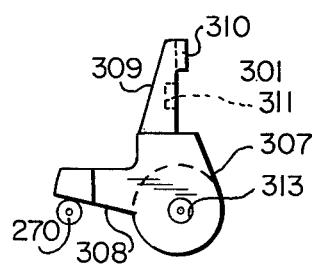
Figure 43:
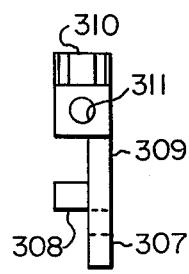
Figure 44:
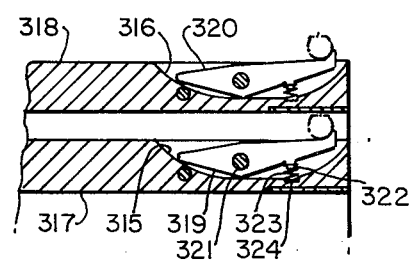
Figure 45:
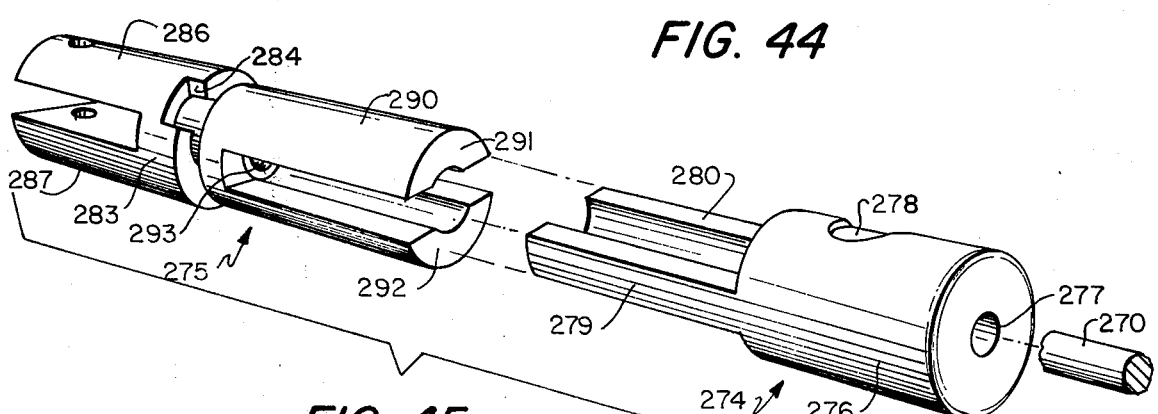
Figure 46:
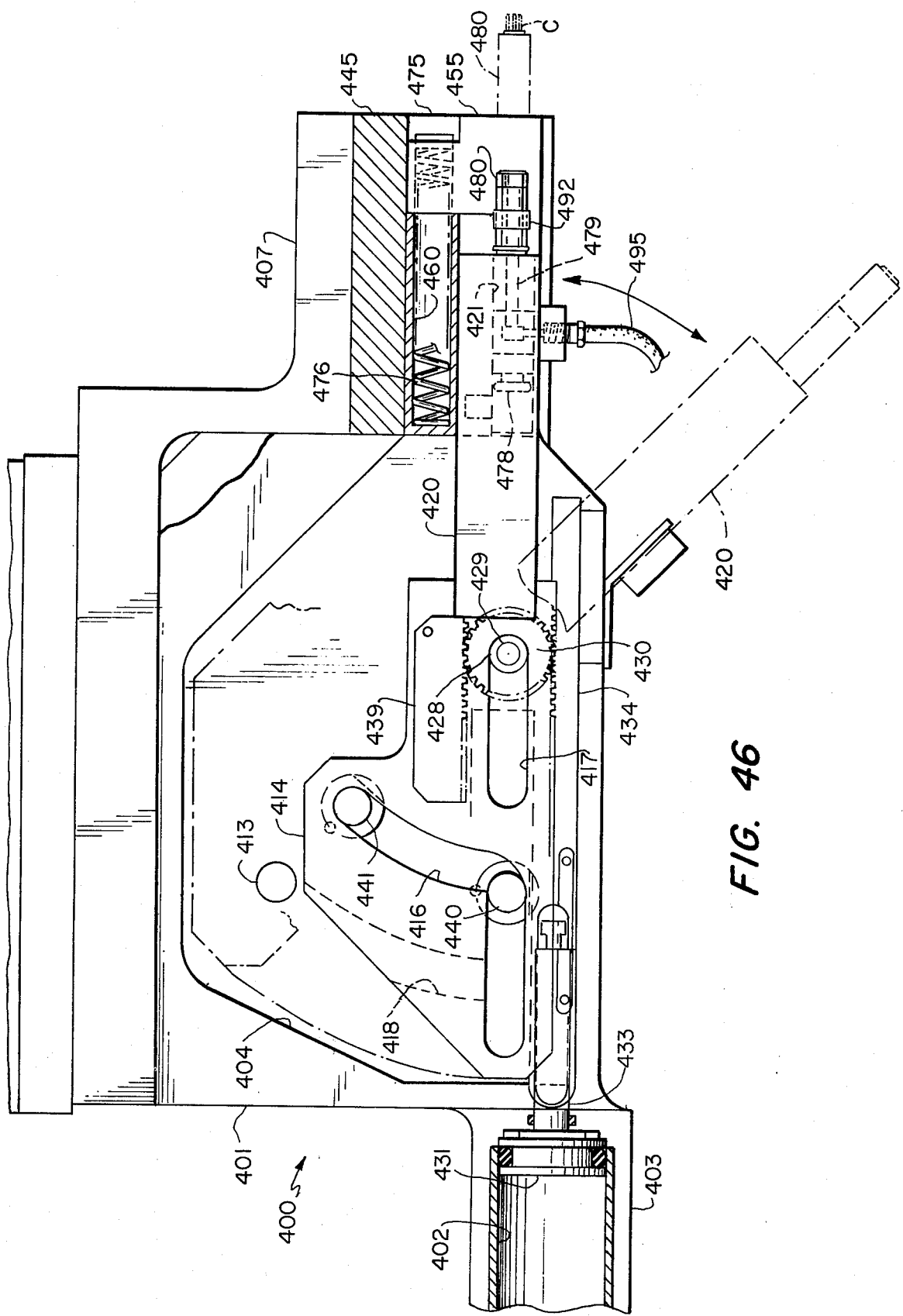
Figure 47:
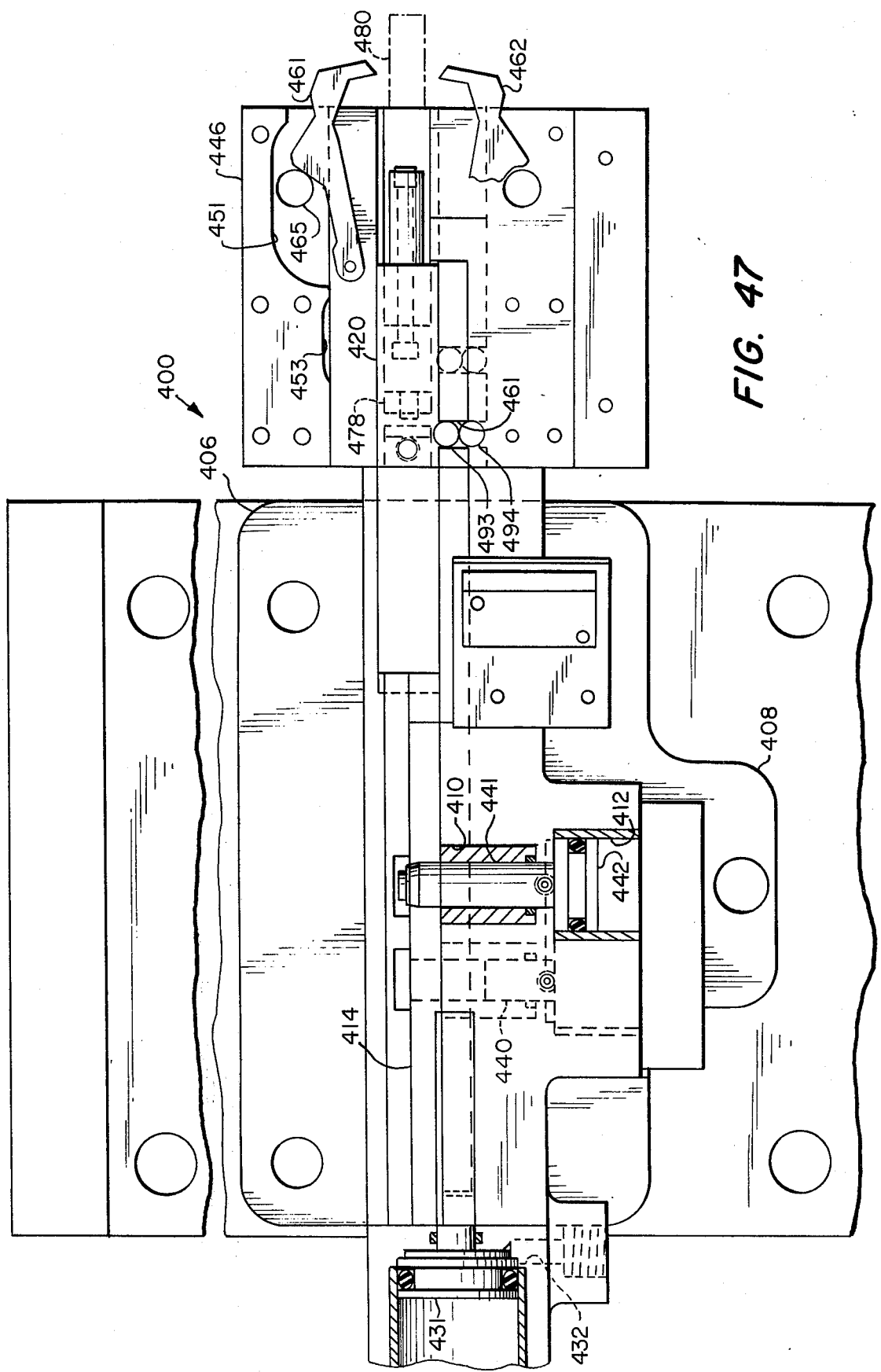
Figure 71:
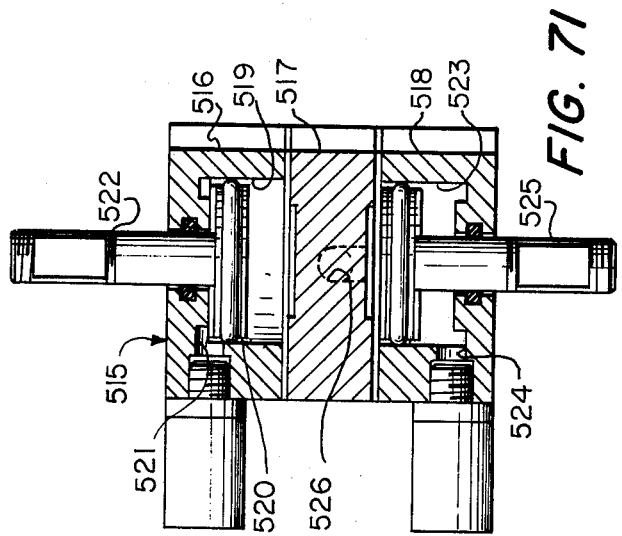
Figure 72:
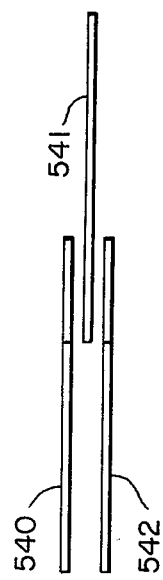
Figure 67:
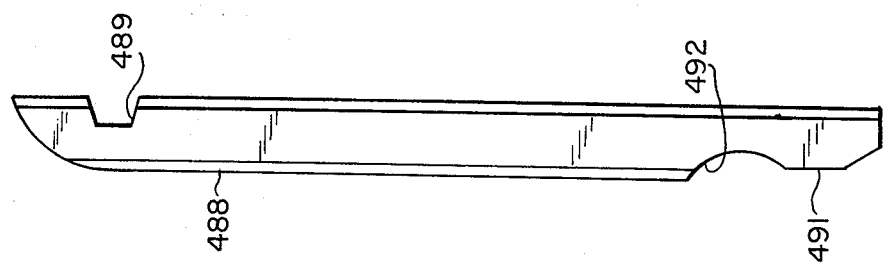
Figure 68:
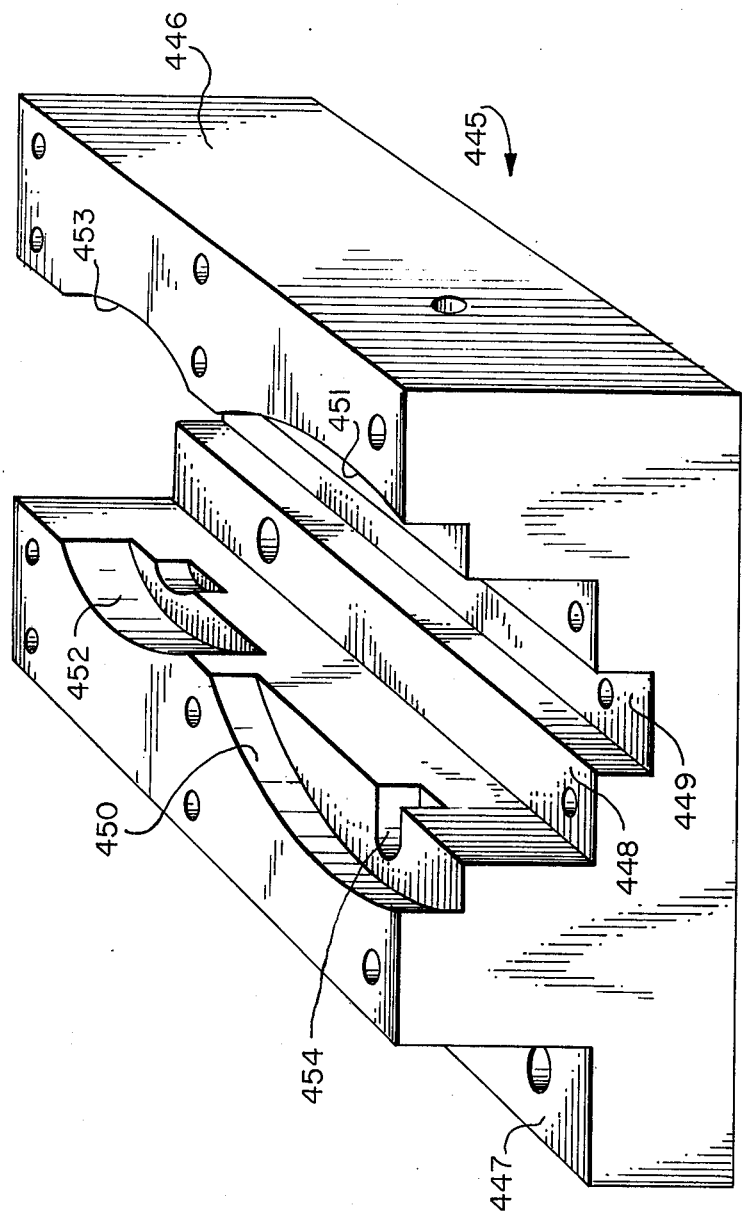
Figure 69:
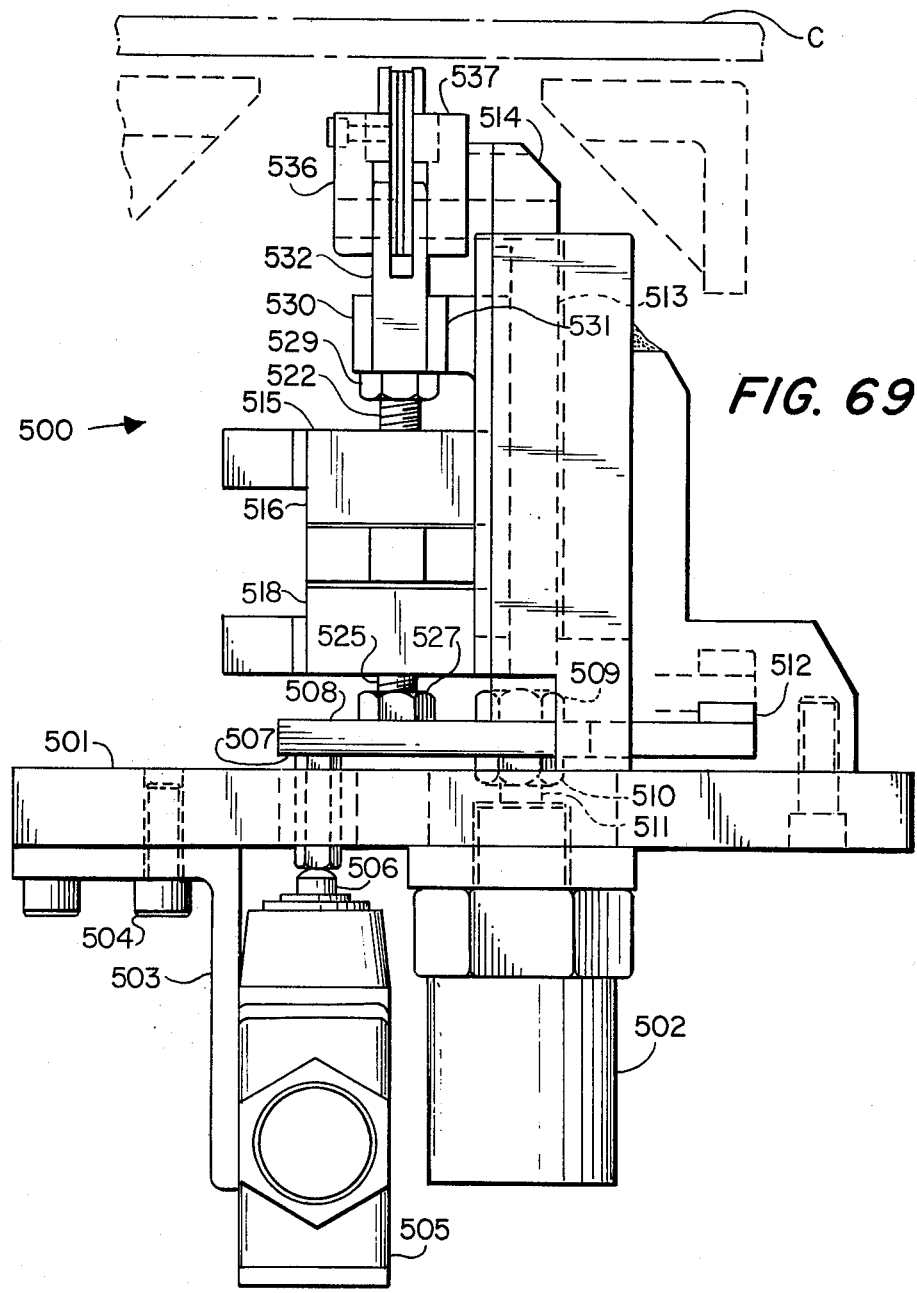
Figure 70:
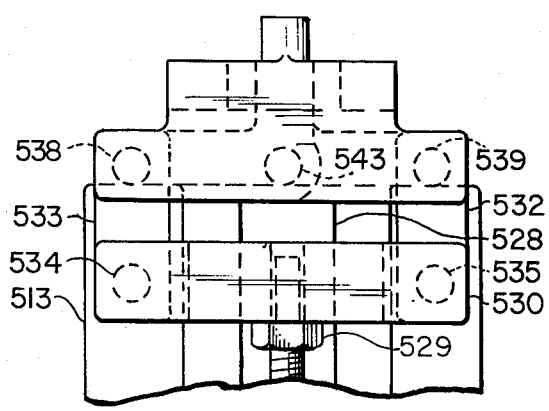
Figure 73:
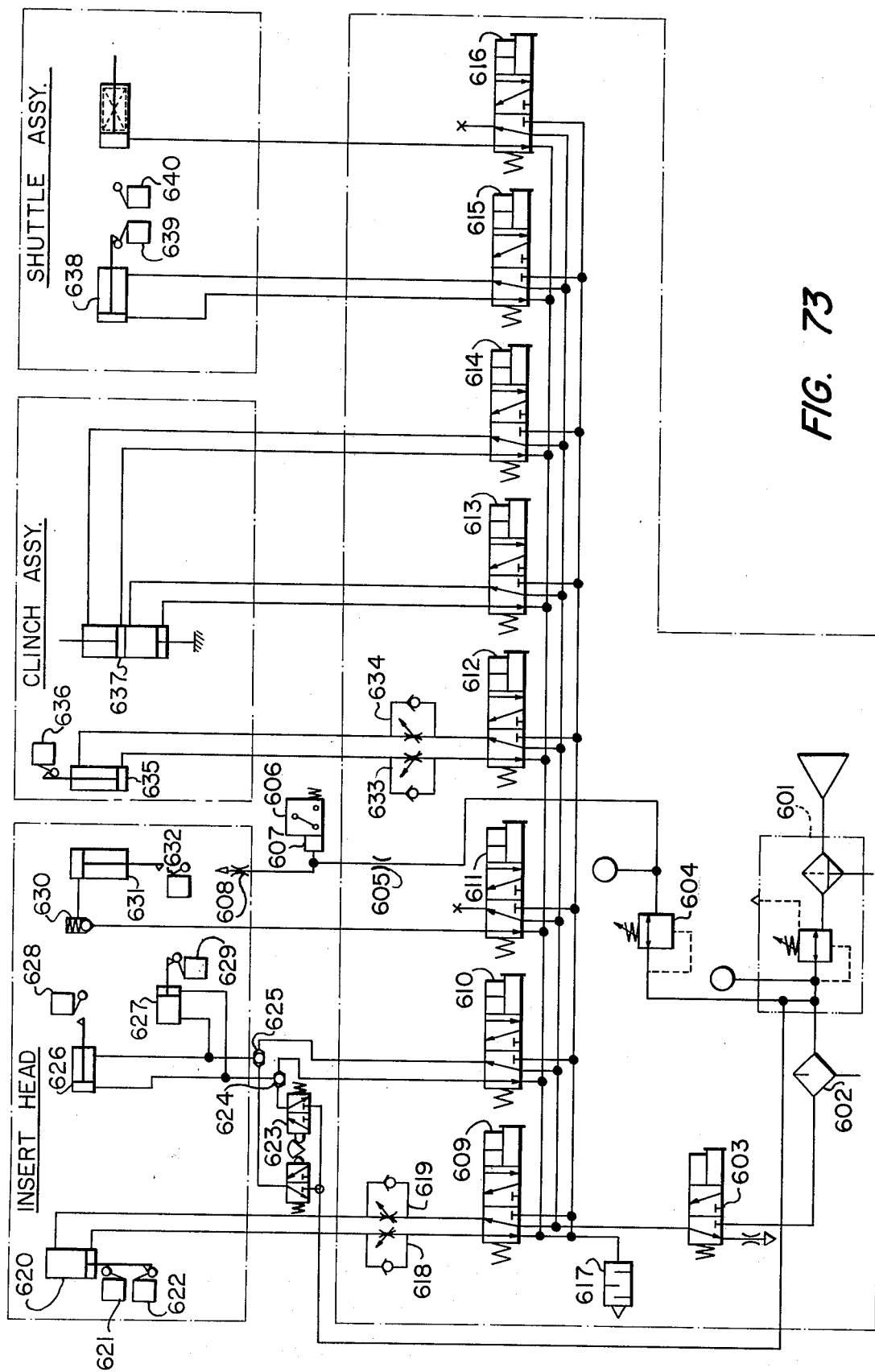

These and other objects will become readily apparent when reference is had to the accompanying specification and drawings in which:

FIG. 1 is an overall perspective view of the apparatus;
FIG. 2 is a perspective view of the magazine, shuttle assembly, insertion head and work table;
FIG. 3 is a top view of the work table;
FIG. 4 is a sectional view of the double acting piston;
FIG. 5 is a side view of the drive motor;
FIG. 6 is a side view of the activator;
FIG. 7 is a side view of a typical switch assembly on the table;
FIG. 8 is a front view of the switch assembly of FIG. 7;
FIG. 9 is a side view of a dowel pin;
FIG. 10 is an end view of the pin of FIG. 9;
FIG. 11 is a side view of a diamond pin;
FIG. 12 is an end view of the pin of FIG. 11;
FIG. 13 is a side view of the bumper-solenoid mechanism;
FIG. 14 is a top view of the magazine assembly;
FIG. 15 is a side view of the motor and helical screw;
FIG. 16 is a side view of the apparatus;
FIG. 17 is a front view of the magazine;
FIG. 18 is a bottom view of the shuttle assembly;
FIG. 19 is an end view of the shuttle guide;
FIG. 20 is a plan view of the key member;
FIG. 21 is a front view of the trip member;
FIG. 22 is a side view of the trip member;
FIG. 23 is a rear view of the trip member;
FIG. 24 is a top view of the trip member;
FIG. 25 is a front view of one gib member;
FIG. 26 is an end view of the gib member of FIG. 25;
FIG. 27 is a front view of the other gib member;
FIG. 28 is an end view of the gib member of FIG. 27;
FIG. 29 is an end view of the magazine and shuttle assembly;
FIG. 30 is a top view of the magazine and shuttle assembly;

FIG. 31 is a side view of the pivot member;
FIG. 32 is a top view of the pivot member;
FIG. 33 is an end view of the pivot member;
FIG. 34 is a side view of the cam member;
FIG. 35 is a top view of the cam member;
FIG. 36 is an end view of the cam member;
FIG. 37 is a cross-sectional view of the cam member;
FIG. 38 is a top view of the first clamp member;
FIG. 39 is a side view of the member of FIG. 38;
FIG. 40 is an end view of the member of FIG. 38;
FIG. 41 is a top view of the second clamp member;
FIG. 42 is a side view of the member of FIG. 41;
FIG. 43 is an end view of the member of FIG. 41;
FIG. 44 is a side view of a portion of the magazine showing the biased stops that hold the components in place;
FIG. 45 is a perspective view of the pivot and cam;
FIG. 46 is a side view of the insertion head;
FIG. 47 is a front view of the insertion head;
FIG. 48 is a bottom view of the insertion head;
FIG. 49 is a perspective view of the slide member;
FIG. 50 is a side view of the control knob and extension of the insertion head;
FIG. 51 is a front view of the main casting;
FIG. 52 is a side view of the main casting;
FIG. 53 is a side view of a guide comb;
FIG. 54 is an end view of a first comb;
FIG. 55 is an end view of a second comb;
FIG. 56 is a side view of the collet mounting bracket;
FIG. 57 is a front view of the collet mounting bracket;
FIG. 58 is the rear view of the collet mounting bracket;
FIG. 59 is a partial view of the bracket of FIG. 56 showing a detent.
FIG. 60 is an end view of the collet mounting bracket;
FIG. 61 is a side view of the gear rack;
FIG. 62 is a front view of the gear rack;
FIG. 63 is an end view of the gear rack;
FIG. 64 is a sectional view of the collet;
FIG. 65 is a side view of the collet;
FIG. 66 is an end view of the collet;
FIG. 67 is a side view of the collet pressure arm;
FIG. 68 is a perspective view of the main guide;
FIG. 69 is a side view of the clinching mechanism;
FIG. 70 is a partial front view of the clinching mechanism;
FIG. 71 is a sectional view of the clinching cylinder;
FIG. 72 shows a typical clinching wiper blade arrangement;
FIG. 73 is a diagrammatic view of the pneumatic assembly; and
FIG. 74 is a perspective view of a typical transistor.

Figure 74:
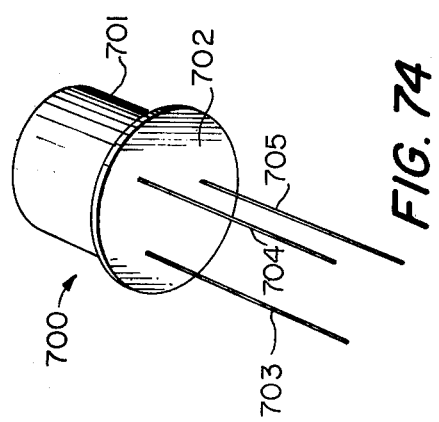

It should be noted that FIGS. 1 and 2 show the entire apparatus, FIGS. 3–13 the work table, FIGS. 14–45 the magazine and shuttle assembly, FIGS. 46–68 the insertion head assembly, FIGS. 69–72 the clinching assembly, FIG. 73 the pneumatic control assembly, and FIG. 74 a typical component.

Referring now to FIGS. 1 and 2, the overall device is shown designated as 10. It comprises an X-Y positioning assembly having motor, support 12, X-bars 13, Y-bars 14, drive cover 15, main support 16, and upper support member 17. Vibratory bowl feeders 18, 19, 20 are shown feeding components down feed track arrangements 21, 22, 23 (note the extending leads of the components). Feed "sticks" can also be used in lieu of the vibratory bowl feeders and has been described. The feed tracks engage the magazine and shuttle assembly 200 having pivot, side plate 204, and shuttle 234.

The insertion head assembly 400 shows the lower portion 420 of the swing arm, main guide 445, manual knob 497. Also shown is the clinch assembly 500.

The apparatus is supported on table 25 which incorporates a control console 26.

Referring now to FIGS. 3–13, there is shown the work table generally designated as 100. The table 101 is mounted for X axis movement on rods (not shown) that are also mounted on a Y axis assembly (not shown). Table 101 has a circular cut 102 therein in which work holder 103 is adapted to rotate clockwise. Holder 103 has an opening 104 therein and is undercut as at 105. The circuit board (not shown) is adapted to be placed within the confines of 105. Dowel pins such as 106, having a bearing surface such as 107 and threaded portion, and diamond pins such as 108, having chisled surfaces 109, 110, 111 and 112 and threaded portion 113, secure a circuit card or board in place.

A series of bearing and switch assemblies such as 114, 115, 116 and 117 are located around the periphery of opening 104. Assembly 114, shown in FIGS. 7 and 8 is representative and shows a bracket 118 mounted to table 101 by bolts such as 119. Another second bracket member 120 is mounted in a cut-out portion 121 of Table 101 and secured to the first bracket by bolts such as 122. A bearing 123 is mounted in bracket 120 for rotation therein and bears against the edge of holder 103. A switch mounting bracket 124 is mounted atop bracket 120 and has switch 125 mounted thereon. Switch 125 is a contact switch and has a spring arm 126 and a roller 127 for engagement by four stud members such 128 (FIG. 6) which has spacer 129 and nut 130 securing it to holder 103. The studs engage the rollers on the switches as 103 rotates clockwise.

Also shown in FIG. 6 is a cam follower plate 131 mounted on table 101 and having upper and lower roller cams 132 and 133 which grip the upper and lower edges of holder 103 to support it as it rotates.

A drive motor 134 (FIG. 5) is mounted in a biased fashion to table 101 by studs 135, 136 and compression springs 137, 138 and motor mount 139 and mounts a drive wheel 140 that is biased downwardly against the top of holder 103 and is adapted to drive it in a clockwise direction. A cam 141 and holder 142 under the drive wheel insures that the edge of holder 103 is steady and in engagement with wheel 140.

FIG. 4 shows a double acting piston assembly 143 having a dual cylinder 144 the end of which is secured to a pivot bar 145 by bolts or machine screws 146. Bar 145 is adapted to mount the dual cylinder 144 and accompanying components for rotation about pivot screw 147. A chamber 148 in the face of bar 145 is in open communication with air passage 149. Air coming in passage 149 activates rear piston 150 having flanges 151, 152 and gasket 153. Piston 150 operates within rear chamber 154 and front piston 155 operates within front chamber 156. A pair of air passages 157, 158 allows air under pressure to move the front piston 155 in either direction.

Bolts 159, 160 hold seal plate 161 and front plate 162 in place. Front plate 162 is connected to pressure plate 163 (FIGS. 3 and 4).

Piston 155 has piston rod 164 extending therefrom which connects into bore 165 in slide member 166 and is secured therein by screw 167.

The base of slide 166 is channeled as at to receive the projecting portion 169 of guide member 170 held in place by machine screw 171. The projecting portion of slide 166 has an arcuate indentation surrounded by projections 172 and 173 (FIG. 3). This indentation receives a stud 174 identical to 128. Extension of slide 166 engages stud 174 and upon engagement, pivots assembly 143 slightly so that pressure plate 143 engages switch 175 and its contact roller 176 and bumper of solenoid 178. Solenoid 178 is connected to bumper 177 by rod 179 and to table 101 by mounting block 180.

Other cam supports such as 181, 182, and 183 are located around the periphery of table 101 to support rotary holder 103.

The various switches around table 101 monitor the table location by engagement with activater 184 (FIG. 3) having arcuate activating surface 185. When positioning holder 103 at either 0°, 90°, 180° or 270° rotation, one of the studs engage projection 173 of slide 166 and pressure plate 163 engages both bumper 177 and switch roller 176. This activates the cylinder assembly 166 to force piston 155 out to its maximum extent thus locking the holder 103 in one of four possible positions. When it does this the end of channel 168 is rounder so as to lock against circular projection 169 of guide 170 thereby preventing assembly 143 from pivoting on 147. As it locks, the pressure on bumper 177 is eased thereby indicating that the holder is locked and an insertion cycle can commence.

Referring now to FIGS. 14–45 there is shown the magazine and shuttle assembly designated generally as 200.

A spacer 201 connects the front support 202 with the main structure of the apparatus. FIG. 14 shows the top view of the magazine assembly. A pair of side plates 203 and 204 are connected to front support 202 and have a bottom guide 205 mounted therebetween. Guide 205 is connected with a top guide 206 (FIG. 29) by posts 207 and 208. A safety cover 209 is secured to side plate 204 by bracket 210.

Top guide 206 has a series of notches 211 and a series of U-shaped clips such as 212 secured thereto by machine screws 213. The clips are adapted to secure the top ends of component sticks, the cross-section of a sample stick being shown in FIG. 14 and 214. Tower guide 205 has a series of notches such as 215 which, in conjunction with a series of arcuate guides such as 216 are adapted to receive the bottom of the sticks. Naturally, these portions are used if sticks are to be employed. The arcuate guides are held in place by machine screws 217 and spacers 218. A brace 219 (FIG. 29) is located beneath guide 205 and receives machine screws such as 217. Arcuate spacers such as 220 are also secured between bottom guide 205 and guides 216 and have a projection 221 at the top thereof. Machine screws such as 222, 223 and 224 secure these guides and spacers in an arcuate configuration to bar 225, brace 226, bar 227 and angle 228.

The angle 228 and angle 229 (FIG. 30) secure guide 230 to the bottom of the magazine assembly. The guide 230 has a pair of wing portions (FIG. 19) 231 and 232 projecting therefrom. A pair of gibs 233 and 234 have portions 235, 236 (FIGS. 26 and 28), respectively which engage using portions 231 and 232 to hold the shuttle therebetween.

Referring to FIG. 15, there is shown a drive motor 237, support 238, clutch housing 239 and encoder 240. A clutch 241 is located inside housing 239 for easy disassembly of encoder 240 from the motor 237. Motor 237 is secured to frame member 242 and drives shaft 243 which, in turn, is secured to flange 244 of pulley 245 by set screw 246. A belt 247 connects driving pulley 245 with screw pulley 248 which is mounted on adapter 249. Adapter 249 is connected in a driving manner to helical threaded shaft 250 by shim 251, cap 252, spacer 253, belt tensioner 254 (FIG. 29) and collar member 255.

Adapted for reciprocal movement on shaft 250 is shuttle 260 (FIGS. 18 and 30). It is comprised of a main housing 256, a rear chamber 257 (FIG. 30), counterbored as at 258, a front chamber 259 and a small bore 261 connecting the two chambers.

Mounted on each side of housing 256 are gibs 233 and 234 which engage guide 230. A key 262 (FIG. 18) secures adapter 264 in the rear chamber 257 by machine screws 263. Adapter 264 has a projection 265, a portion 266 which interfits within chamber 257 and an enlarged portion having bore 267 into which fits the end of shaft 250.

A piston plunge 268 is biasedly mounted in rear chamber 257 by spring 269 and has a plunger rod 270 extending therefrom.

An air line 271 connects with injection parts 272 and 273 to admit air into the front and rear chambers.

Mounted within front chamber 259 are cam 274 and pivot 275. Referring to FIGS. 30–37, cam 274 has a main body 276 with a bore 277 passing therethrough for sliding passage of plunger rod 270. It has an arcuate cam groove 278 on its surface and a pair of projecting portions 279 and 280 thereon, the inner surfaces of which are curved and of a diameter to accept a compression spring 281 (FIG. 30) surrounding rod 270. It has a slight counterbore 282 to accept the end of spring 281.

Pivot 275 has body portion 283 cut away as at 284 to allow a projection 285 on the front of housing 256 to engage therein and allow for limited arcuate movement of pivot 275 relative to the housing 256. The body portion is cut away to provide clamp gripping arms 286 and 287 which receive pin 289 (FIG. 30). The other end of pivot 275 has a reduced diameter portion cut away so as to produce portions 290 and 292. Portions 280 and 279 of cam 274 are slidably received between portions 291 and 292 of pivot 275. A counterbore 293 receives the other end of spring 281. The pivot 275 is bored to allow for through passage of plunger rod 270. A hole 294 is bored in pivot 283 which receives a rod 295 (FIG. 29). As pivot 275 rotates reciprocally, rod 294 engages limit switches 296 and 297. As shown in FIG. 18, the switches are secured to a key adapter 298 (FIG. 20), bar 299 and housing 234 by machine screws such as 299.

Mounted between portions 286 and 287 of pivot 275 are clamps 300 and 301 shown in FIGS. 38–43. Clamp 300 has body portion 302, cam arm 303 and pressure arm 304 with lead clamping pad 305. Arm 304 has a bore 306 which receives one end of a tension spring (not shown) which keeps the clamping pads apart.

Clamp 301 has body portion 307, cam arm 308, pressure arm 309, clamping pad 310. Bore 311 receives the other end of the tension spring. Clamp 301 is actually reversed from the position shown in FIG. 42 so that pad 305 fits into cup-shaped portion 310. Pin 289 is received through holes 312 and 313 in clamps 300 and 301 respectively. When the plunger rod 270 is thrust forward it engages on cam arms 303 and 308 and forces the pads 305 and 310 together. The clamps are prevented from being forced apart too far by the cam surfaces engaging each other.

Mounted in the side of housing 234 is cam follower 314 which engages in cam groove 278. As air is forced into the front chamber the cam rotates, thus rotating the clamps to a pickup position. Air is then introduced into the rear chamber 257 which acts upon piston 268 thus forcing rod 270 between the cam arms and the pads 305 and 310 together to grasp the component leads.

FIG. 44 shows the ends of a pair of spacers 317 and 318 having cut away as at 315 and 316, to receive a pivotable detent 319, 320. Each detent pivots on a pin such as 321 and has s projection 322 which engages a spring 323 in bore 324. The end projection 325 keeps the component bodies in place until the clamps engage the leads.

Mounted on the side of big 233 is a trip 326 (FIGS. 18 and 21–24). It has a body portion 327, mounting holes such as 328 and a flange portion 329. The top is composed of surfaces 330–333. These surfaces engage the rollers 334 and 335 on limit switches 336 and 337, respectively.

Referring now to FIGS. 46–68 there is shown the insertion head mechanism generally designated as 400. It consists of a main casting 401 (FIGS. 51 and 52) having chamber 402 in one portion 403 thereof. A central area 404 is relieved to receive the swing arm or collet mounting bracket and collet rack. Hole 405 is adapted to receive the shaft of a gear. Mounting tab portions 406 and 408 are for mounting the assembly 400 to the main apparatus 10. Tab portion 407 secures the main guide to the casting.

There are two additional chambers 409 and 410 for housing pin pistons and bores 411, 412 for receipt of sleeves for the piston rods. A stud 413 projects up from the surface of the cut away area 404 to act against the reverse side of the swing arm.

Swing arm or collet mounting bracket 414 (FIGS. 56–60) has an enlarged portion 415 with a first L-shaped channel 416 and a straight channel 417 cut therein. A shallow groove 418 is cut in the opposite side thereof and receives stud 413. The upper portion is slightly notched as at 419. Tower portion 420 of swing arm 414 is wider than upper portion 415 and has a bore 421 therein. Projecting portion 422 has a bore 423 therein in communication with bore 421. Bore 421 is countersunk as at 424 and in communication with air inlet 425. The edge of lower portion 420 is notched as at 426 to engage detent balls. Hole 427 bisects the lower end of the portion 420.

Swing arm 414 is seen in position in FIG. 46 in casting 401. A shaft 428 with bushing 429 holds gear 430 between the casting 401 and a cover plate (not shown). A piston 431 is adapted to move upward in chamber with the ingress of air through port 432 (FIG. 47) carrying with it piston rod 433. The end of rod 433 is connected to gear rack 434 (FIGS. 61–63) which has an elongated rack portion having teeth such as 436 to engage gear 430 and an enlarged head portion 437 and rod attachment channel 438. Cut 419 in swing arm 414 is to allow for movement of head portion 437. A collet gear plate 439 is secured to swing arm 414 so that when 434 moves upwardly, plate 439 tends to move in the opposite direction.

pivot pins 440 and 441 are positioned for alternate engagement within channel 416. When pin 440 is in place, upward movement of gear rack 434 causes straight opposite movement of swing arm 414 (insertion stroke) and when pin 441 is in place, a swinging motion about gear shaft 429 occurs.

FIG. 47 shows pins 440 and 441 which are identically mounted. Pin 441 is the rod of pivot piston 442 in chamber 412. Bushing 443 is positioned in bore 410. An air hole 444 allows for air under pressure to retract piston 442 and pin 441. The same construction applies to pin 440.

Attached to the tab portion 407 of casting 401 is main guide 445 (FIGS. 46, 48 and 68). It has a body portion 446, mounting tab 447 a channel 448 for slidably receiving slide 455 including a narrow channel 449, arcuate recessed portions 450 and 451 for housing comb guides, slightly recessed areas 452 and 453 for allowing transverse movement of ball detents and channels such as 454 for receiving comb guide stops.

Received within main guide 445 is slide member 455 (FIG. 49). It has a central channel 456 in which lower portion 420 of swing arm 414 resides. Each side is channeled as at 457, 458 to provide clearance for the guide combs. Depending portion 459 is bored as at 460 and the main portion is undercut to provide longitudinal grooves (not shown) on each side of the depending portion 459.

Comb guides such as 461, 462 are pivotally mounted in the channel portions 457, 458 of the slide member. FIG. 53 shows the general configuration of a comb guide which pivots about pin has arcuate surfaces 463 and 464, both of which act in conjunction with cam 465 to maintain the end 466 of the comb out of the way of the component leads as it descends during the insertion cycle. Between these surfaces is projection 467 which acts on the opposing comb guides to force them inwardly to comb and straighten the leads to insure alignment with predrilled holes in the circuit board. Comb 461 has teeth such as 468 shown in FIG. 55 while comb 460 has teeth 469. Teeth 468 are angled as at 470 while teeth 469 are straight.

FIG. 48 shows a cam member 471 held in place by shaft 472, nut 473 and set screw 474. An end cap 475 secures a compression 476 within bore 460 of slide 455 thus biasing it upwardly.

Mounted within chamber 421 of swing arm portion 420 is a collet piston (free floating) 478. Air entering the chamber above the piston forces it downwardly to where it engages ejection rod 479. Secured within the chamber and having a central passage 481 therethrough for sliding movement of the ejection rod is collet 480. It has a main body portion 482, a channel 483, a notch 484 and a pair of channels in a varying diameter body. A depending portion 487 provides support for the component body While collet pressure arms such as 488 are biasedly held in channels 485 and 486 by a resilient band such as 492 (FIG. 46). Arms such as 488 have an upper notch 489 where a non-resilient gasket engages them to maintain them in place in annular groove 490 in collet 480. They are cut away as at 492 and have component engaging portions 491.

Slide 455 has a recess 461 which engages ball detents 493, 494 which engage in notch 426 of swing arm portion 420 to carry the slide down with the until cut away portions 452, 453 of the main guide 445 are reached allowing the balls to shift and slide 455 is biased back upwardly. This facilitates the combing action of the comb guides 461 and 462. The position of the balls and collet 480 in this release or insertion position are shown in phantom lines in FIG. 47.

A pneumatic line 495 brings air to chamber 421.

FIG. 50 shows a hand shaft 496 and knob 497 which is connected to piston 431 for manual operation in setting up. A collar stop and nut 499 is used to limit the amount of travel.

Referring now to FIGS. 69–72, there is shown the lead clinching assembly designated generally as 500. The unit has a base 501 under which is mounted a pneumatic cylinder unit 502. A bracket 503, secured to base 501 by machine screws 504 or the like, supports a solenoid 505 having actuating button 506. Button 506 is adapted to be activated by plunger 507 which is mounted to the base of plate member 508. Plate member 508 is attached, via nuts 509, 510 to the piston shaft 511 of cylinder 502 and is adapted to move upwards upon activation thereof. Portion 512 of member 508 is adapted to activate a button on another solenoid (not shown). A slide member 513 is also adapted to move with member 508 as well as clinch support 514 and clinching cylinder 515. Cylinder 515 (FIGS. 69 and 71) is composed of three portions, 516, 517 and 518, the first and last being identical opposites. Portion 516 has chamber 519 in which piston 520 is adapted to move. An air inlet 521 is connected to chamber 519 in open communication therewith. Piston shaft 522 extends from piston 520 and is threaded. The portion 517 has air inlets such as 526 in communication with chamber 519 (not shown) and chamber 523 in portion 518. Air inlet 524 is also in communication with chamber 523. Piston shaft 525 extends from portion 518. Shaft 525 is secured to plate 508 by nut 427. Shaft 522 is secured to a pivot member 528 by nut 529. Plate members 530 and 531 are secured to link members 532, 533 by pivot pins such 534, 535 and the link members are secured to wiper guide members 536, 537 by pivot pins 538, 539.

Mounted between guide members 536, 537 are three L-shaped wiper blades 540, 541 and 542. Blades 540 and 542 have their base leg extending in the same direction while blade 541 has its base leg extending in the opposite direction. See FIG. 72 for a top view. The ends of legs 540 and 542 receive pivot pin 538 while the end of leg 541 receives pin 539. The vertical legs of each blade are parallel and adjacent and each blade is secured to pivot member 528 by pivot pin 543. Member 537 is attached to support 519.

When a clinching operation is to commence, cylinder 502 raises the clinching assembly to a position just underneath the circuit board C. The pistons in portions 516 and 518 are then activated causing the L-shaped blades to pivot about pivot pins 538 and 539. This causes the upper edges of the vertical portions of blades 540 and 542 to move in one direction while the upper edge of the vertical portion of blade 541 moves in the opposite direction, thus clinching the leads underneath the circuit board C.

FIG. 73 shows the pneumatic assembly in diagrammatic form and it is generally designated as 600. A filter-regulator is shown at 601 which is connected via lubricator 602 to three-way valve 603. Filter-regulator 601 is also connected, via regulator 604 and choke 605, to switch 606, pilot activator 607 and to port in head sensor 608.

Three-way valve 603 is connected to four-way valves 609–616 which are connected in parallel and to muffler. Valve 609 is connected via a pair of flow control valves 618, 619 to drive cylinder 620. Limit switches 621 and 622 monitor the movement of the cylinder. Regulator 601 is also connected to selecter valve and shuttle valves 624 and 625 which, in turn, are connected to four-way valve 610, and to insert cylinder 626 and swing arm cylinder 627. Limit switch 628 monitors cylinder 626 and limit switch 629 monitors cylinder 627.

Valve 611 is connected with quick exhaust valve 630 and insert plunger 631. Limit switch 632 monitors plunger 631.

Valve 612 is connected via flow control valves 633, 634 to anvil cylinder 635 which is monitored by limit switch 636.

Valves 613 and 614 are connected to double wiper cylinder 637. Valve 615 is connected to rotate cylinder 638 which is monitored by limit switches 639 and 640. Valve 616 is connected to clamp cylinder 641. The various pneumatic valves can be operated electrically or manually.

FIG. 74 shows a typical component that is handled by the apparatus. Component 700 has a body 701, a base 702 and leads 703–705. Other components, such as those having all the leads aligned can be handled by the apparatus with modifications to the collet and clinching mechanisms.

While only one embodiment of the device has been shown and described, it will be obvious to those of ordinary skill in the art that many changes and modifications may be made without department from the scope of the appended claims.

We claim:
1. An apparatus for sequentially selecting a predetermined electrical component, transferring it to a position whereupon it is inserted into a circuit board and clinching said component, said apparatus comprising a magazine means, transport means for selecting components from said magazine means and transporting them to a transfer position, component insertion means for taking components from said transport means at said transfer position and for inserting them into pre-existing holes in a circuit board, said component insertion means including a swing arm means, having a collet means on the end thereof, for swinging out and picking up components from said transfer means by engaging them with its collet means and bringing them back to an in-line insertion position, means for holding said circuit board in varied positions and orientations to said insertion means and for repositioning said circuit board between insertion cycles and means for cutting and clinching said component leads located beneath said circuit board.

2. An apparatus as in claim 1 wherein said magazine means comprises a plurality of slots for receiving a plurality of components, each slot having biased stop means at the base thereof whereby a stack of components can be held in each slot.

3. An apparatus as in claim 2 wherein each slot has a spring clip at the top thereof to allow for the attachment of clips of components to be attached thereto.

4. An apparatus as in claim 2, said transfer means comprises a shuttle means for moving longitudinally across the base of the slot means.

5. An apparatus as in claim 4 wherein said shuttle means includes a helical screw shaft, motor means to rotate said shaft, a shuttle housing siding on said shaft, said housing having biased apart component grasping finger means for grasping the components by their leads.

6. an apparatus as in claim 5 wherein said housing contains a pneumatic cylinder and cam means, said cam means for bringing said finger means together upon activation of said pneumatic cylinder.

7. An apparatus as in claim 1 wherein said insertion means includes two alternately activated piston pivot means, said swing arm swings out and picks up a component upon activation of one pivot means and travels downward toward the circuit board upon activation of said other pivot means.

8. An apparatus as in claim 7 wherein said insertion apparatus includes lead straightening and forming means for engaging the leads as the swing arm proceeds downwardly to insert the components.

9. An apparatus as in claim 1 wherein said collet means includes a partial cavity and biased finger means to grasp the bodies of components.

10. An apparatus as in claim 9 wherein said collet means additionally includes an ejection rod means to insure that the component body stays flush on the circuit board when the collet means commences its upward movement.

11. An apparatus as in claim 1 wherein said means to hold the circuit board in position includes a X-Y axis positioning means and rotary table means mounted on said positioning means.

12. An apparatus as in claim 11 wherein said rotary table means includes a circular plate, a peripheral drive means to rotate said plate, bearing means to support said plate as it rotates and a stop means to stop said rotation at any one of four positions 90° apart.

* * * * *